US011791130B2

(12) United States Patent
Hamada et al.

(10) Patent No.: US 11,791,130 B2
(45) Date of Patent: Oct. 17, 2023

(54) ELECTRON BEAM OBSERVATION DEVICE, ELECTRON BEAM OBSERVATION SYSTEM, AND IMAGE CORRECTING METHOD AND METHOD FOR CALCULATING CORRECTION FACTOR FOR IMAGE CORRECTION IN ELECTRON BEAM OBSERVATION DEVICE

(71) Applicant: Hitachi High-Tech Corporation, Tokyo (JP)

(72) Inventors: Koichi Hamada, Tokyo (JP); Megumi Kimura, Tokyo (JP); Momoyo Enyama, Tokyo (JP); Ryou Yumiba, Tokyo (JP); Makoto Sakakibara, Tokyo (JP); Kei Sakai, Tokyo (JP); Satoru Yamaguchi, Tokyo (JP); Katsumi Setoguchi, Tokyo (JP); Masumi Shirai, Tokyo (JP); Yasunori Takasugi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 344 days.

(21) Appl. No.: 17/299,153

(22) PCT Filed: Jan. 23, 2019

(86) PCT No.: PCT/JP2019/001968
§ 371 (c)(1),
(2) Date: Jun. 2, 2021

(87) PCT Pub. No.: WO2020/152795
PCT Pub. Date: Jul. 30, 2020

(65) Prior Publication Data
US 2022/0051868 A1 Feb. 17, 2022

(51) Int. Cl.
*H01J 37/28* (2006.01)
*H01J 37/153* (2006.01)
*H01J 37/22* (2006.01)

(52) U.S. Cl.
CPC ............ *H01J 37/28* (2013.01); *H01J 37/153* (2013.01); *H01J 37/222* (2013.01); *H01J 2237/2817* (2013.01)

(58) Field of Classification Search
CPC .. H01J 37/00; H01J 37/26; H01J 37/28; H01J 37/02; H01J 37/153; H01J 37/222;
(Continued)

(56) References Cited

U.S. PATENT DOCUMENTS 7,116,816 B2 * 10/2006 Tanaka .................... H01J 37/28
382/172
9,702,695 B2 7/2017 Kawada et al.
(Continued)

FOREIGN PATENT DOCUMENTS

CN 102292790 A 12/2011
CN 105518821 A 4/2016
(Continued)

OTHER PUBLICATIONS

Taiwanese-language Office Action issued in Taiwan Application No. 110117997 dated Mar. 24, 2022 (three (3) pages).
(Continued)

*Primary Examiner* — Jason L McCormack
(74) *Attorney, Agent, or Firm* — Crowell & Moring LLP

(57) ABSTRACT

The objective of the present invention is to reduce differences between individual electron beam observation devices accurately by means of image correction. This method for calculating a correction factor for correcting images between a plurality of electron beam observation devices, in electron beam observation devices which generate images by scan- (Continued)

ning an electron beam across a specimen, is characterized by including: a step in which a first electron beam observation device generates a first image by scanning a first electron beam across first and second patterns, on either a specimen including the first pattern and the second pattern, having a different shape or size to the first pattern, or a first specimen including the first pattern and a second specimen including the second pattern; a step in which a second electron beam observation device generates a second image by scanning a second electron beam across the first and second patterns; and a step in which the first or second electron beam observation device calculates a correction factor at a peak frequency extracted selectively from first and second frequency characteristics calculated on the basis of the first and second images.

28 Claims, 25 Drawing Sheets

(58) Field of Classification Search
CPC ......... H01J 2237/2817; H01J 2237/223; H01J 2237/2816
USPC .......................................... 250/306, 307, 311
See application file for complete search history.

(56) References Cited

U.S. PATENT DOCUMENTS

| | | | |
|---|---|---|---|
| 2001/0016237 A1 | 8/2001 | Bahr et al. | |
| 2003/0132383 A1* | 7/2003 | Benner | H01J 37/265 250/311 |
| 2005/0247860 A1 | 11/2005 | Shishido et al. | |
| 2008/0099674 A1* | 5/2008 | Bihr | G03F 1/72 250/311 |
| 2012/0019648 A1 | 1/2012 | Hoshino et al. | |
| 2013/0301954 A1 | 11/2013 | Shirai et al. | |
| 2016/0203944 A1 | 7/2016 | Ominami et al. | |
| 2017/0025251 A1 | 1/2017 | Enyama et al. | |
| 2018/0330511 A1* | 11/2018 | Ha | G06F 30/00 |
| 2018/0372652 A1 | 12/2018 | Immer et al. | |
| 2021/0125806 A1 | 4/2021 | Hamada et al. | |
| 2022/0051868 A1 | 2/2022 | Hamada et al. | |

FOREIGN PATENT DOCUMENTS

| | | | |
|---|---|---|---|
| JP | 2005-322423 A | 11/2005 |
| JP | 2006-153837 A | 6/2006 |
| JP | 5596141 B2 | 9/2014 |
| JP | 2017-27829 A | 2/2017 |
| KR | 10-0551606 B1 | 6/2006 |
| KR | 10-2013-0110206 A | 10/2013 |
| TW | 201911360 A | 3/2019 |
| TW | I731559 B | 6/2021 |

OTHER PUBLICATIONS

Korean-Language Office Action issued in Korean Application No. 10-2021-7011351 dated Nov. 30, 2022 (nine (9) pages).

International Search Report (PCT/ISA/210) issued in PCT Application No. PCT/JP2019/001968 dated Feb. 26, 2019 with English translation (two (2) pages).

Japanese-language Written Opinion (PCT/ISA/237) issued in PCT Application No. PCT/JP2019/001968 dated Feb. 26, 2019 (three (3) pages).

Taiwanese-language Office Action issued in Taiwanese Application No. 109101965 dated Oct. 30, 2020 (three (3) pages).

* cited by examiner

FREQUENCY CHARACTERISTIC A
OF IMAGE CAPTURED BY DEVICE A
(HORIZONTAL FREQUENCY)

FREQUENCY CHARACTERISTIC B
OF IMAGE CAPTURED BY DEVICE B
(HORIZONTAL FREQUENCY)

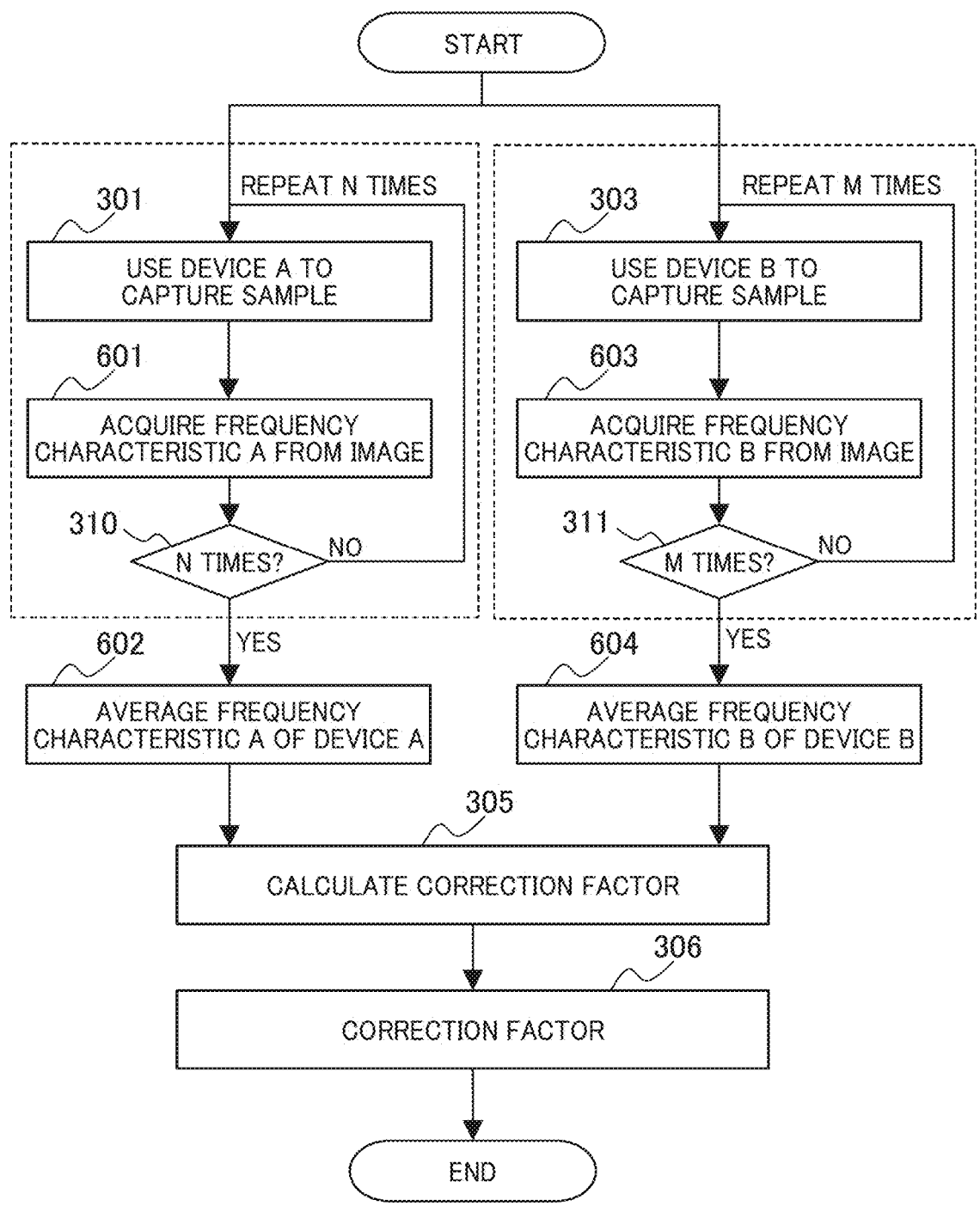

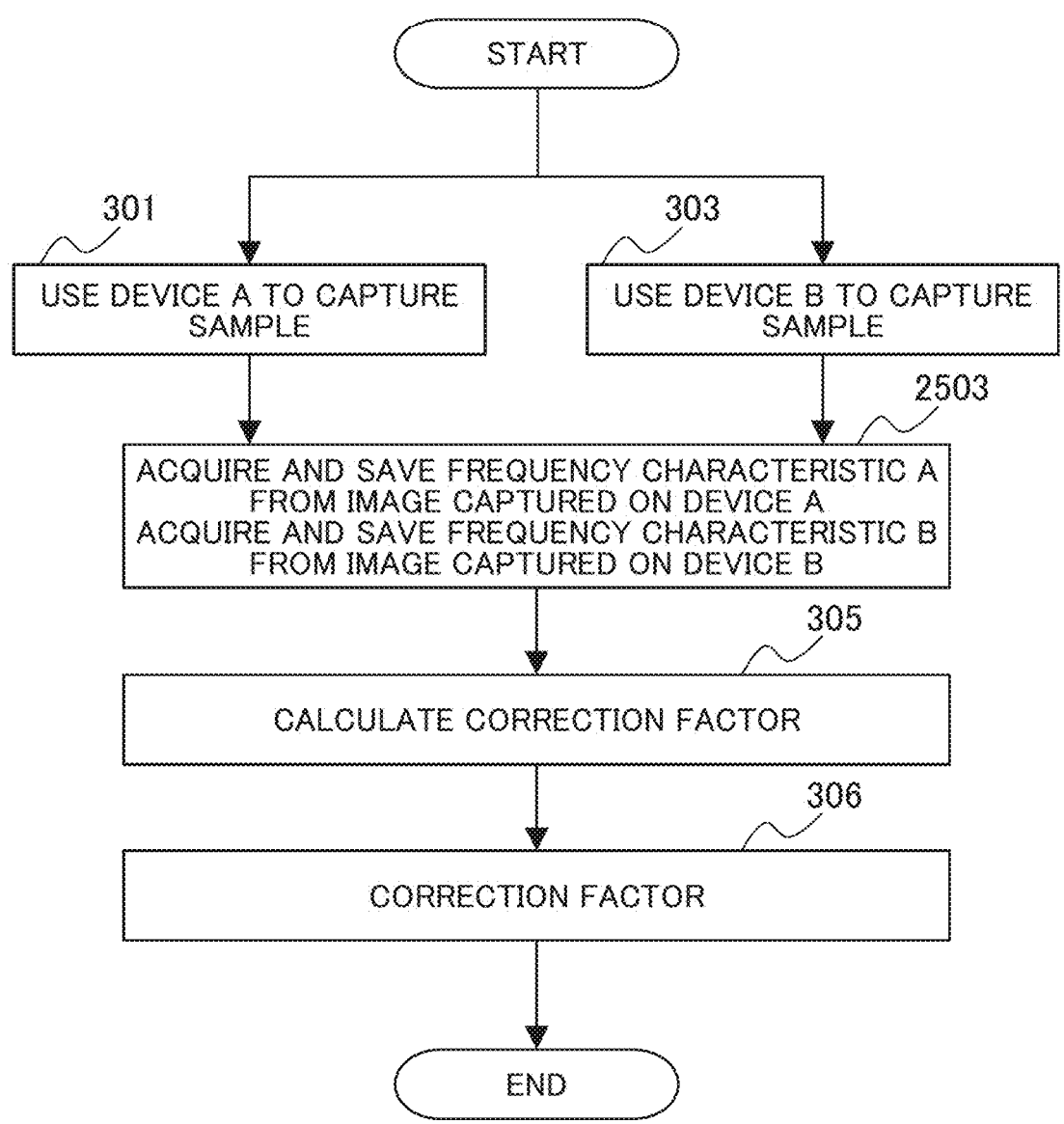

ELECTRON BEAM OBSERVATION DEVICE, ELECTRON BEAM OBSERVATION SYSTEM, AND IMAGE CORRECTING METHOD AND METHOD FOR CALCULATING CORRECTION FACTOR FOR IMAGE CORRECTION IN ELECTRON BEAM OBSERVATION DEVICE

TECHNICAL FIELD

The present invention relates to an electron beam observation device that performs inspection or measurement using an electron beam.

BACKGROUND ART

An electron beam observation device such as a scanning electron microscope (SEM) uses an electron beam to observe, inspect, or measure specimens. The electron beam observation device accelerates electrons emitted from an electron source, converges them on the specimen surface through the use of an electrostatic lens or an electromagnetic lens, and irradiates them. This electron is called a primary electron.

The injection of the primary electron causes the specimen to emit a secondary electron. Depending on conditions, low-energy electrons are called secondary electrons, and high-energy electrons are called backscattered electrons. It is possible to acquire scanned images of a fine pattern or composition distribution on the specimen by detecting the secondary electrons while deflecting and scanning the electron beam. It is also possible to form an absorbed current image by detecting the electrons absorbed by the specimen.

CITATION LIST

Patent Literature

Patent literature 1: Japanese Unexamined Patent Application Publication No. 2017-27829
Patent literature 2: Japanese Patent No. 5596141 (corresponding to U.S. Pat. No. 9,702,695)

SUMMARY OF INVENTION

Technical Problem

The electron beam observation devices include a critical dimension-scanning electron microscope (CD-SEM) that measures the dimensions of fine patterns of a semiconductor, for example, from an acquired image. It is favorable that this device ensures a small difference (machine difference) in length measurement values among multiple devices. Until now, efforts have been made to reduce machine differences to an acceptable range through the use of hardware or software adjustment. However, existing methods of reducing machine differences are approaching the limits with the further miniaturization of patterns of semiconductors, for example. For example, patent literature 1 discloses a method for estimating a profile of the primary electron beam, sharpening an image based on the profile, and performing highly accurate dimension measurement.

However, the conventional example disclosed in patent literature 1 does not clarify a method for accurately finding the intensity distribution of primary electron beams used for correction. A conventional scanning electron microscope forms images of an electron source on a specimen. Therefore, the intensity distribution of primary electron beams is determined by electron source images, optical aberration, or beam oscillation, for example. Furthermore, a resulting image indicates the effect of electron beam scattering in the specimen.

Patent literature 2 describes that it is necessary to monitor the measurement accuracy of the length measurement electron microscope and adjust and configure devices so that all devices used on semiconductor manufacturing lines always produce measurement results with the same accuracy. However, the same literature does not necessarily clarify a means for resolving machine differences (image differences) among multiple devices resulting from shape differences in electron beams, for example.

It is extremely hard to accurately recognize electron beam shapes. Therefore, it is difficult to accurately reduce the machine difference based on image correction using a profile of estimated electron beams. Moreover, the shape of the electron beam slightly varies with aging after the use of devices or influences of the usage environment, for example. The machine difference (image difference) may exceed a permissible range. A multi-beam device or a multi-column device may also cause a slight electron beam difference (image difference) due to aging after the use of devices or influences of the usage environment, for example. The present invention proposes a method for solving these issues and accurately reducing the machine difference.

Solution to Problem

The following description concisely explains an overview of representative aspects according to the present disclosure.

(1) A correction factor calculation method in an electron beam observation device for correcting images among a plurality of the electron beam observation devices each of which generates an image by scanning an electron beam over a specimen, comprises the steps of: allowing a first electron beam observation device to generate a first image by scanning a first electron beam over a first pattern and a second pattern differing from the first pattern in a shape or a size, in which the first pattern and the second pattern are included in a specimen, or the first pattern is included in a first specimen and the second pattern is included in a second specimen; allowing a second electron beam observation device to generate a second image by scanning a second electron beam over the first and second patterns; and allowing one of the first and second electron beam observation devices to calculate a correction factor at a peak frequency selectively extracted from first and second frequency characteristics calculated based on the first and second images.

(2) A method in an electron beam observation device for correcting images among a plurality of the electron beam observation devices each of which generates an image by scanning an electron beam over a specimen, comprises the steps of: allowing a first electron beam observation device to generate a first image by scanning a first electron beam over a first pattern and a second pattern differing from the first pattern in a shape or a size, in which the first pattern and the second pattern are included in a specimen, or the first pattern is included in a first specimen and the second pattern is included in a second specimen; allowing a second electron beam observation device to generate a second image by scanning a second electron beam over the first and second patterns; allowing one of the first and second electron beam observation devices to calculate a correction factor at a peak frequency selectively extracted from first and second frequency characteristics calculated based on the first and second images; and allowing one of the first and second electron beam observation devices to use the correction factor and correct a third image acquired by one of the first and second electron beam observation devices.

(3) In an electron beam observation system including a plurality of electron beam observation devices that generate images by scanning an electron beam over a specimen, a first electron beam observation device includes a first computer system that generate a first image by scanning a first electron beam over a first pattern and a second pattern differing from the first pattern in a shape or a size, in which the first pattern and the second pattern are included in a specimen, or the first pattern is included in a first specimen and the second pattern is included in a second specimen; a second electron beam observation device includes a second computer system that generates a second image by scanning a second electron beam over the first and second patterns; one of the first and second computer systems calculates a correction factor at a peak frequency selectively extracted from first and second frequency characteristics calculated based on the first and second images; and one of the first and second computer systems uses the correction factor and corrects a third image acquired by one of the first and second electron beam observation devices.

(4) A correction factor calculation method in an electron beam observation device for correcting images among a plurality of the electron beam observation devices each of which generates an image by scanning an electron beam over a specimen, comprises the steps of: allowing a first electron beam observation device to generate a first image by scanning a first electron beam over a first pattern and a second pattern differing from the first pattern in a shape or a size, in which the first pattern and the second pattern are included in a specimen, or the first pattern is included in a first specimen and the second pattern is included in a second specimen; allowing the first electron beam observation device to calculate a first frequency characteristic based on the first image; allowing a second electron beam observation device to generate a second image by scanning a second electron beam over the first and second patterns; allowing the second electron beam observation device to calculate a second frequency characteristic based on the second image; and allowing one of the first and second electron beam observation devices to calculate a correction factor at a peak frequency selectively extracted from the first and second frequency characteristics.

(5) A method in an electron beam observation device for correcting images among a plurality of the electron beam observation devices each of which generates an image by scanning an electron beam over a specimen, comprises the steps of: allowing a first electron beam observation device to generate a first image by scanning a first electron beam over a first pattern and a second pattern differing from the first pattern in a shape or a size, in which the first pattern and the second pattern are included in a specimen, or the first pattern is included in a first specimen and the second pattern is included in a second specimen; allowing the first electron beam observation device to calculate a first frequency characteristic based on the first image; allowing a second electron beam observation device to generate a second image by scanning a second electron beam over the first and second patterns; allowing the second electron beam observation device to calculate a second frequency characteristic based on the second image; allowing one of the first and second electron beam observation devices to calculate a correction factor at a peak frequency selectively extracted from the first and second frequency characteristics; and allowing one of the first and second electron beam observation devices to use the correction factor and correct a third image acquired by one of the first and second electron beam observation devices.

(6) In an electron beam observation system including a plurality of electron beam observation devices that generate images by scanning an electron beam over a specimen, a first electron beam observation device includes a first computer system that generate a first image by scanning a first electron beam over a first pattern and a second pattern differing from the first pattern in a shape or a size, and calculates a first frequency characteristic based on the first image, in which the first pattern and the second pattern are included in a specimen, or the first pattern is included in a first specimen and the second pattern is included in a second specimen; a second electron beam observation device includes a second computer system that generates a second image by scanning a second electron beam over the first and second patterns and calculates a second frequency characteristic based on the second image; one of the first and second computer systems calculates a correction factor at a peak frequency selectively extracted from the first and second frequency characteristics; and one of the first and second computer systems uses the correction factor and corrects a third image acquired by one of the first and second electron beam observation devices.

(7) A correction factor calculation method for correcting images among a plurality of electron beam observation devices in an electron beam observation system including the electron beam observation device to generate an image by scanning an electron beam over a specimen and a computer system to manage image differences among a plurality of the electron beam observation devices, comprises the steps of: allowing a first electron beam observation device to generate an image by scanning a first electron beam over a first pattern and a second pattern differing from the first pattern in a shape or a size, in which the first pattern and the second pattern are included in a specimen, or the first pattern is included in a first specimen and the second pattern is included in a second specimen; allowing a second electron beam observation device to generate a second image by scanning a second electron beam over the first and second patterns; and allowing the computer system to calculate a correction factor at a peak frequency selectively extracted from first and second frequency characteristics calculated based on the first and second images.

(8) A method for correcting images among a plurality of electron beam observation devices in an electron beam observation system including the electron beam observation device to generate an image by scanning an electron beam over a specimen and a computer system to manage image differences among a plurality of the electron beam observation devices, comprises the steps of: allowing a first electron beam observation device to generate an image by scanning a first electron beam over a first pattern and a second pattern differing from the first pattern in a shape or a size, in which the first pattern and the second pattern are included in a specimen, or the first pattern is included in a first specimen and the second pattern is included in a second specimen; allowing a second electron beam observation device to generate a second image by scanning a second electron beam over the first and second patterns; allowing the computer system to calculate a correction factor at a peak frequency selectively extracted from first and second frequency characteristics calculated based on the first and second images; and allowing one of the first and second electron beam observation devices to use the correction factor and correct a third image acquired by one of the first and second electron beam observation devices.

(9) An electron beam observation system comprising: an electron beam observation device to generate an image by scanning an electron beam over a specimen; and a third computer system to manage image differences among a plurality of the electron beam observation devices, in which: a first electron beam observation device includes a first computer system that generates an image by scanning a first electron beam over a first pattern and a second pattern differing from the first pattern in a shape or a size, in which the first pattern and the second pattern are included in a specimen, or the first pattern is included in a first specimen and the second pattern is included in a second specimen; a second electron beam observation device includes a second computer system that generates a second image by scanning a second electron beam over the first and second patterns; the third computer system calculates a correction factor at a peak frequency selectively extracted from first and second frequency characteristics calculated based on the first and second image; and one of the first and second computer systems uses the correction factor and corrects a third image acquired by one of the first and second electron beam observation devices.

(10) A correction factor calculation method for correcting images among a plurality of electron beam observation devices in an electron beam observation system including the electron beam observation device to generate an image by scanning an electron beam over a specimen and a computer system to manage image differences among a plurality of the electron beam observation devices, comprises the steps of: allowing a first electron beam observation device to generate an image by scanning a first electron beam over a first pattern and a second pattern differing from the first pattern in a shape or a size, in which the first pattern and the second pattern are included in a specimen, or the first pattern is included in a first specimen and the second pattern is included in a second specimen; allowing the first electron beam observation device to calculate a first frequency characteristic based on the first image; allowing a second electron beam observation device to generate a second image by scanning a second electron beam over the first and second patterns; allowing the second electron beam observation device to calculate a second frequency characteristic based on the second image; allowing the computer system to specify a reference frequency characteristic based on the first and second frequency characteristics; and allowing one of the first and second electron beam observation devices to calculate a correction factor at a peak frequency selectively extracted from the reference frequency characteristic and one of the first and second frequency characteristics.

(11) A method for correcting images among a plurality of electron beam observation devices in an electron beam observation system including the electron beam observation device to generate an image by scanning an electron beam over a specimen and a computer system to manage image differences among a plurality of the electron beam observation devices, comprises the steps of: allowing a first electron beam observation device to generate an image by scanning a first electron beam over a first pattern and a second pattern differing from the first pattern in a shape or a size, in which the first pattern and the second pattern are included in a specimen, or the first pattern is included in a first specimen and the second pattern is included in a second specimen; allowing the first electron beam observation device to calculate a first frequency characteristic based on the first image; allowing a second electron beam observation device to generate a second image by scanning a second electron beam over the first and second patterns; allowing the second electron beam observation device to calculate a second frequency characteristic based on the second image; allowing the computer system to specify a reference frequency characteristic based on the first and second frequency characteristics; allowing one of the first and second electron beam observation devices to calculate a correction factor at a peak frequency selectively extracted from the reference frequency characteristic and one of the first and second frequency characteristics; and allowing one of the first and second electron beam observation devices to use the correction factor and correct a third image acquired by one of the first and second electron beam observation devices.

(12) In a method for correcting images among a plurality of electron beam observation devices in an electron beam observation system that includes an electron beam observation device to generate an image by scanning an electron beam over a specimen and a third computer system to manage image differences among a plurality of the electron beam observation devices, in which: a first electron beam observation device includes a first computer system that generate an image by scanning a first electron beam over a first pattern and a second pattern differing from the first pattern in a shape or a size, and calculates a first frequency characteristic based on the first image, in which the first pattern and the second pattern are included in a specimen, or the first pattern is included in a first specimen and the second pattern is included in a second specimen; a second electron beam observation device includes a second computer system that generates a second image by scanning a second electron beam over the first and second patterns and calculates a second frequency characteristic based on the second image; the third computer system specifies a reference frequency characteristic based on the first and second frequency characteristics; one of the first and second computer systems calculates a correction factor at a peak frequency selectively extracted from the reference frequency characteristic and one of the first and second frequency characteristics; and one of the first and second computer systems uses the correction factor and corrects a third image acquired by one of the first and second electron beam observation devices.

(13) A correction factor calculation method for correcting an image in an electron beam observation device that generates an image by scanning a plurality of electron beams over a specimen, comprises the steps of: allowing a first electron beam observation device to generate a first image by scanning a first electron beam over a first pattern and a second pattern differing from the first pattern in a shape or a size, in which the first pattern and the second pattern are included in a specimen, or the first pattern is included in a first specimen and the second pattern is included in a second specimen; generating a second image by scanning a second electron beam over the first and second patterns; and calculating a correction factor at a peak frequency selectively extracted from first and second frequency characteristics calculated based on the first and second image.

(14) A method for correcting an image in an electron beam observation device that generates an image by scanning a plurality of electron beams over a specimen, comprises the steps of: allowing a first electron beam observation device to generate a first image by scanning a first electron beam over a first pattern and a second pattern differing from the first pattern in a shape or a size, in which the first pattern and the second pattern are included in a specimen, or the first pattern is included in a first specimen and the second pattern is included in a second specimen; generating a second image by scanning a second electron beam over the first and second patterns; calculating a correction factor at a peak frequency selectively extracted from first and second frequency characteristics calculated based on the first and second image; and using the correction factor and correcting a third image acquired by the electron beam observation device.

(15) In an electron beam observation device that generates an image by scanning a plurality of electron beams over a specimen, in which the electron beam observation device: generate a first image by scanning a first electron beam over a first pattern and a second pattern differing from the first pattern in a shape or a size, in which the first pattern and the second pattern are included in a specimen, or the first pattern is included in a first specimen and the second pattern is included in a second specimen; generates a second image by scanning a second electron beam over the first and second patterns; calculates a correction factor at a peak frequency selectively extracted from first and second frequency characteristics calculated based on the first and second image; and uses the correction factor and corrects a third image acquired by the electron beam observation device.

Advantageous Effects of Invention

The present invention enables image processing after the image capture to reduce a machine difference (image difference) among multiple devices caused by shape differences of electron beams, for example, or an electron beam difference (image difference) of a multi-beam device or a multi-column device.

BRIEF DESCRIPTION OF DRAWINGS

FIG. 5 is a flowchart illustrating a modification of the first embodiment of the present invention and a process to calculate a correction factor from frequency characteristics;

FIG. 25 is a flowchart illustrating the first embodiment of the present invention and a process to calculate a correction factor from frequency characteristics.

DESCRIPTION OF EMBODIMENTS

Embodiments of the present invention will be described with reference to the accompanying drawings. The description below explains a scanning electron microscope as an example of the electron beam observation device. However, the present invention is also applicable to electron beam observation devices other than the scanning electron microscope.

First Embodiment

Figure 1:
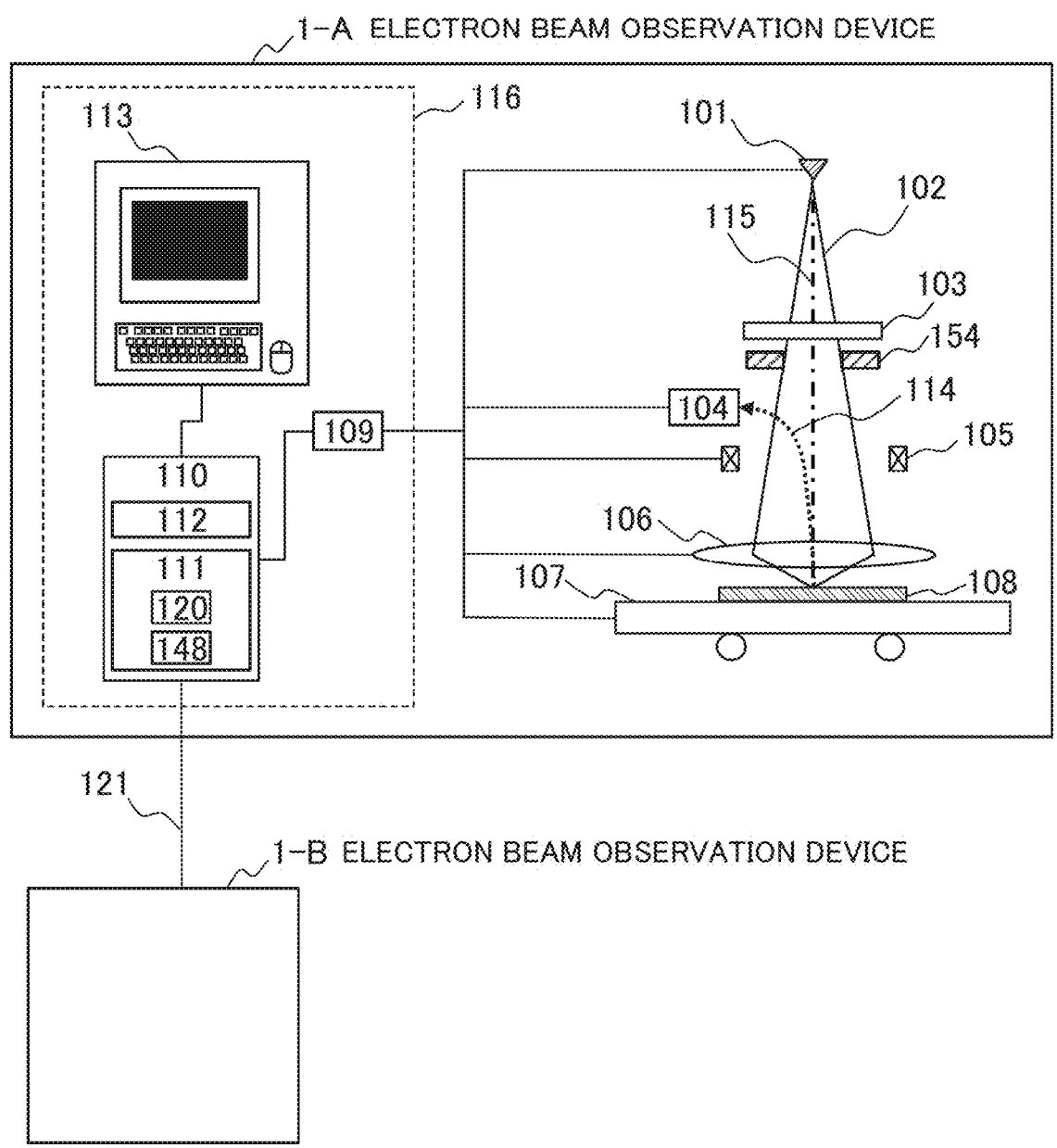
FIG. 1 is a block diagram illustrating a first embodiment of the present invention and an electron beam observation device.

FIG. 1 is a block diagram illustrating a schematic configuration of an electron beam observation device (scanning electron microscope) according to the first embodiment. The illustrated example shows an electron beam observation system that connects an electron beam observation device 1-B with an electron beam observation device 1-A via a communication means 121 such as a data bus or network. The electron beam observation device 1-A and the electron beam observation device 1-B are configured to be able to transmit and receive data to and from each other via the communication means 121. The electron beam observation device 1-A and the electron beam observation device 1-B are configured similarly. Only the electron beam observation device 1-A will be described. The electron beam observation device 1 represents the electron beam observation devices 1-A and 1-B when they are not distinguished.

The hardware configuration will be described first. An electron beam (electron ray) 102 is irradiated from an electron source (electron gun) 101 in the downstream direction (downward in the drawing). A modified illumination aperture 103, an aperture plate 154, a detector 104, a scanning deflector 105, and an objective lens 106 are placed in the downstream direction. Though not illustrated, an electron optical system also includes an aligner for adjusting the central axis (optical axis) of a primary beam and an aberration corrector, for example.

The objective lens 106 in the first embodiment exemplifies an electromagnetic lens using an exciting current to control the focus. However, the objective lens 106 may be available as an electrostatic lens or a combination of an electromagnetic lens and an electrostatic lens.

The computer system 116 includes a system control portion 110, a control device 109, and an input/output portion 113.

A wafer, namely, a specimen 108 is placed on a stage 107 capable of moving. The electron source 101, the detector 104, the scanning deflector 105, the objective lens 106, and the stage 107 are connected to the control device 109. The control device 109 further connects with the system control portion 110.

Functionally, the system control portion 110 includes a storage device 111 and a calculation portion 112 and connects with the input/output portion 113 including an image display device. Though not illustrated, components other than the control system and the circuit system are placed in a vacuum container and operate under the vacuum exhaust condition. In addition, a wafer transport system is provided to place a wafer on the stage 107 from outside the vacuum.

More specifically, the system control portion 110 is configured to include a central processing portion available as the calculation portion 112 and a storage portion available as the storage device 111. The central processing portion as the above-described calculation portion 112 executes a control program 120 or an image processing portion 148 stored in the storage device 111. As a result, it is possible to process images related to defect inspection or dimension measurement or control the control device 109, for example. The image processing portion 148 is a program that processes SEM images.

The first embodiment may use a generic term of control portion to signify the system control portion 110 including the input/output portion 113 and the control device 109, for example. The input/output portion 113 may be separately configured as an input portion and an output portion correspondingly represented by the input means such as a keyboard and a mouse and the display means such as a liquid crystal display device. Alternatively, the input/output portion 113 may be configured as an integrated input/output means using a touch panel, for example.

The description below explains an image observation performed through the use of devices according to the first embodiment. The objective lens 106 controls focusing of the electron beam 102 emitted from the electron source 101. The electron beam 102 is focused on the specimen 108 so that the beam diameter is minimized.

The control device 109 controls the scanning deflector 105 so that the electron beam 102 scans a predetermined area of the specimen 108. The electron beam 102 reaches the surface of the specimen 108 and interacts with a substance near the surface. The specimen then generates incidental electrons such as backscattered electrons, secondary electrons, and Auger electrons, causing signals to be acquired.

The first embodiment describes a signal as a secondary electron. The detector 104 detects a secondary electron 114 generated from the position where the electron beam 102 reaches specimen 108. Signals output from the detector 104 to detect the secondary electron 114 are processed in synchronization with a scanning signal transmitted from the control device 109 to the scanning deflector 105 to generate an image (SEM image). Then, the specimen 108 is observed. Instead of the image (SEM image), a signal waveform can be generated from output signals of the detector 104. The signal waveform signifies, for example, a signal profile representing the relationship between the position on the surface of the specimen 108 and the amount of secondary electron 114 detected by the detector 104 corresponding to the position.

The generated image can be stored in the storage device 111 or a non-volatile storage device (unshown). The image processing portion 148 (to be described) processes images stored in a storage portion such as the storage device 111 or non-volatile storage devices.

According to the first embodiment, the detector 104 is placed upstream of the objective lens 106 and the scanning deflector 105. However, the order of placement may be changed. Though not illustrated, an aligner to correct the optical axis of the electron beam 102 is placed between the electron source 101 and the objective lens 106. The aligner can correct the central axis of the electron beam 102 if it is misaligned against the aperture or the electron optical system.

The electron beam observation devices 1-A and 1-B (hereinafter referred to as device A and device B) may measure the size of a pattern of the specimen 108 from the acquired image. In this case, it is favorable to maintain a small difference (machine difference) in length measurement values among multiple devices.

Conventionally, attempts were made to decrease machine differences to a permissible range by adjusting the constituent components illustrated in FIG. 1 in terms of hardware and software. However, aging after the use of devices A and B or an influence of the usage environment may cause a slight shape difference, for example, in the electron beam and consequently a length measurement value difference (machine difference) over the permissible range.

The first embodiment proposes a method for reducing the machine difference between device A and device B through the use of image processing in the image processing portion 148 in FIG. 1. The first embodiment describes a process to reduce the machine difference between device A and device B.

The first embodiment provides an example of correcting an image captured by device B using device A as a reference device so that the image captured by device B ensures the same frequency characteristic as device A. The description below explains device A and device B as different devices. However, device A and device B may be the same. In this case, the example can apply to a case where device A is treated as device B due to a chronological change or the shape of the aperture plate 154 is changed in device A, for example.

The image processing portion 148 corrects images based on correction factors calculated from the images captured by device A and device B.

Figure 2:
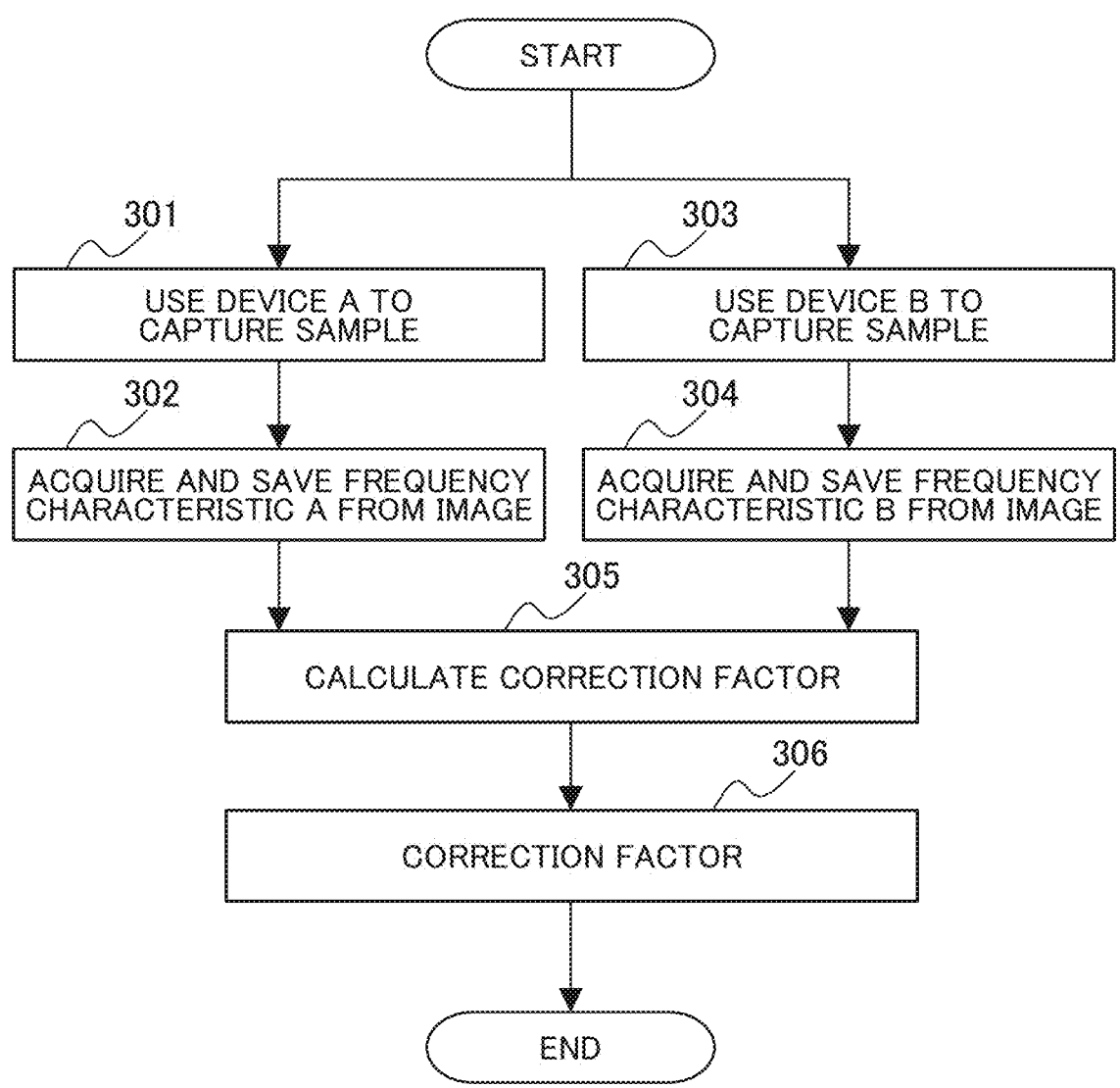
FIG. 2 is a flowchart illustrating the first embodiment of the present invention and a process to calculate a correction factor from frequency characteristics.

FIG. 2 is a flowchart illustrating a procedure to calculate a correction factor.

Device A as a reference device captures an SEM image of the specifically patterned specimen (reference specimen) 108 (301). Device A performs a Fourier transform, for example, on the captured image to calculate and save frequency characteristic A of the image (302).

Frequency characteristics can be calculated by multiplying or dividing the coefficients generated from the conversion of the image into a frequency space image.

Similarly, device B captures an SEM image of the specifically patterned specimen (reference specimen) 108 (303). Device A performs a Fourier transform, for example, on the captured image to calculate and save frequency characteristic B of the image (304). It is favorable to use the same specifically patterned specimen. The specifically patterned specimen is appropriately made of black silicon, for example, that can extract the peak frequency in a relatively wide frequency band.

Suppose device A is assumed to be the reference device and device B is adjusted to device A. Then, the correction factor is calculated as follows.

Correction factor=Frequency characteristic $A$ of device $A$/Frequency characteristic $B$ of device $B$ (Equation 1)

Device A uses (Equation 1) to calculate a correction factor from frequency characteristic A and frequency characteristic B (305). This correction factor is calculated for each pixel after the image is converted into a frequency domain.

According to the example of FIG. 2, device A acquires frequency characteristic B of device B and calculates the correction factor.

FIG. 25 illustrates a flowchart showing that device A calculates frequency characteristic B of an image captured by device B.

Device A as the reference device captures an SEM image of the specifically patterned specimen 108 (301). Similarly, device B captures an SEM image of the specifically patterned specimen 108 (303).

Device A then calculates frequency characteristic A from the image captured by device A to save frequency characteristic A and calculates frequency characteristic B from the image captured by device B to save frequency characteristic B (2503). Device A uses (Equation 1) to calculate a correction factor from frequency characteristic A and frequency characteristic B (305).

The frequency characteristic can be acquired from a single image. However, the frequency characteristics of multiple captured images may be averaged and used to reduce an influence such as value variations due to noise, for example. A smoothing process may be performed on the calculated frequency characteristic to reduce value variations in the frequency characteristic due to noise, for example. FIG. 2 and FIG. 25 are examples of acquiring frequency characteristics from a single image. An example of using multiple images is represented by the processing procedure as illustrated in FIG. 5.

FIG. 5 is a flowchart illustrating a modification of the first embodiment and the process to calculate a correction factor from multiple frequency characteristics.

Device A captures an SEM image of the specifically patterned specimen (reference specimen) 108 (301), repeats the process (601) to calculate frequency characteristic A from the image N times (310), and calculates average frequency characteristic A from as many as N frequency characteristics A (602).

Similarly, device B captures an SEM image of the specifically patterned specimen 108 (303), repeats the process (603) to calculate frequency characteristic B from the image M times (311), and calculates average frequency characteristic B from as many as M frequency characteristics A (604).

Device A captures N images and device B captures M images to acquire average frequency characteristics A and B (602 and 604) in each of devices A and B. Note that N and M each denote a predetermined integer value greater than or equal to 1.

The average of frequency characteristics signifies the average of amplitude characteristics at each frequency. The method for calculating the correction factor (306) is similar to the processing procedure of FIG. 3 described later.

Figure 20:
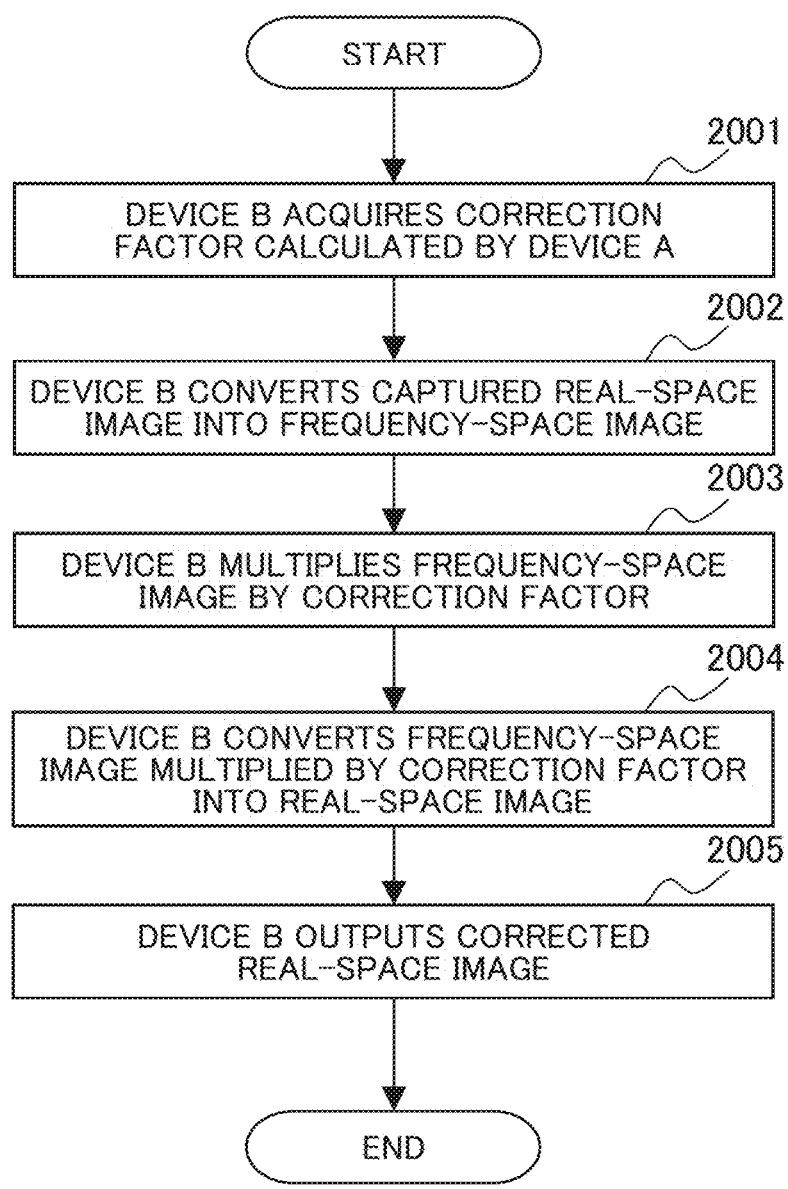
FIG. 20 is a flowchart illustrating the first embodiment of the present invention and an image correcting method.

FIG. 20 illustrates a flowchart showing that device B uses the above-described correction factor (306, 2505) calculated by device A to correct the image captured by device B and converts the image into the same frequency characteristic as device A.

Device B acquires the correction factor (306) calculated by device A (2001). Device B converts the real-space image captured by device B into a frequency-space image (2002) and multiplies each pixel of the frequency-space image by the correction factor (306) (2003). Using techniques such as two-dimensional inverse FFT (Fourier transform), device B converts the frequency-space image multiplied by the correction factor (306) into the real-space image again (2004) and outputs it as the corrected image (2005). The corrected image is corrected to ensure the same frequency characteristic as device A. The machine difference between device B and device A is reduced.

Figure 3:
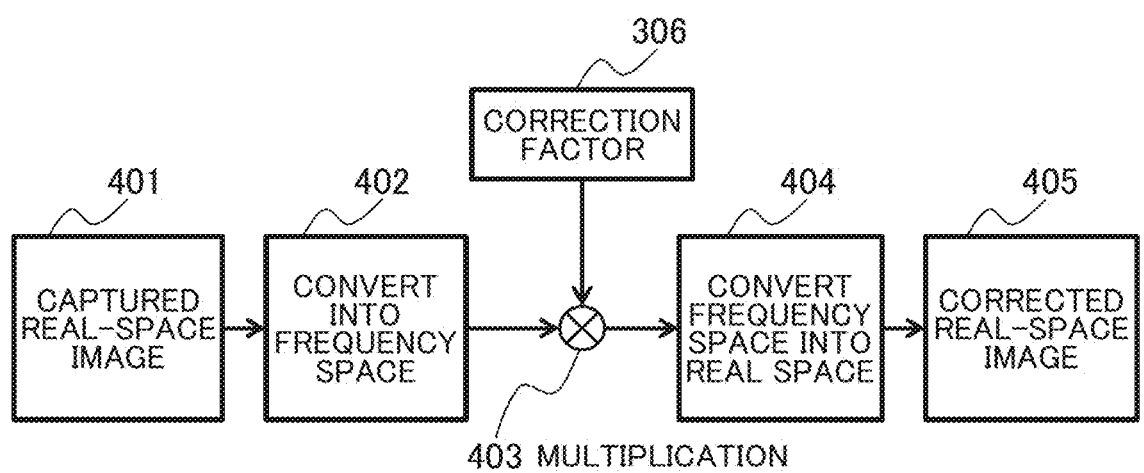
FIG. 3 is a block diagram illustrating a first embodiment of the present invention and an image correction method.

FIG. 3 is a block diagram illustrating the process to acquire a corrected real-space image from the captured real-space image. The captured real-space image 401 is converted into a frequency-space image through the use of techniques such as Fourier transform (402). Then, each pixel in the frequency-space image is multiplied by the correction factor (403). A known or well-known method such as two-dimensional inverse FFT (Fourier transform) is used to convert the frequency-space image multiplied by the correction factor back to a real-space image (404) and output it as a corrected real-space image 405.

The flowchart in FIG. 20 provides the example where device B corrects an image captured by device B by using the correction factor (306) calculated by device A. However, device A may correct an image captured by device B by using the correction factor (306) calculated by device A. Further, device A may correct an image captured by device A by using the correction factor (306) calculated by device A.

Figure 9:
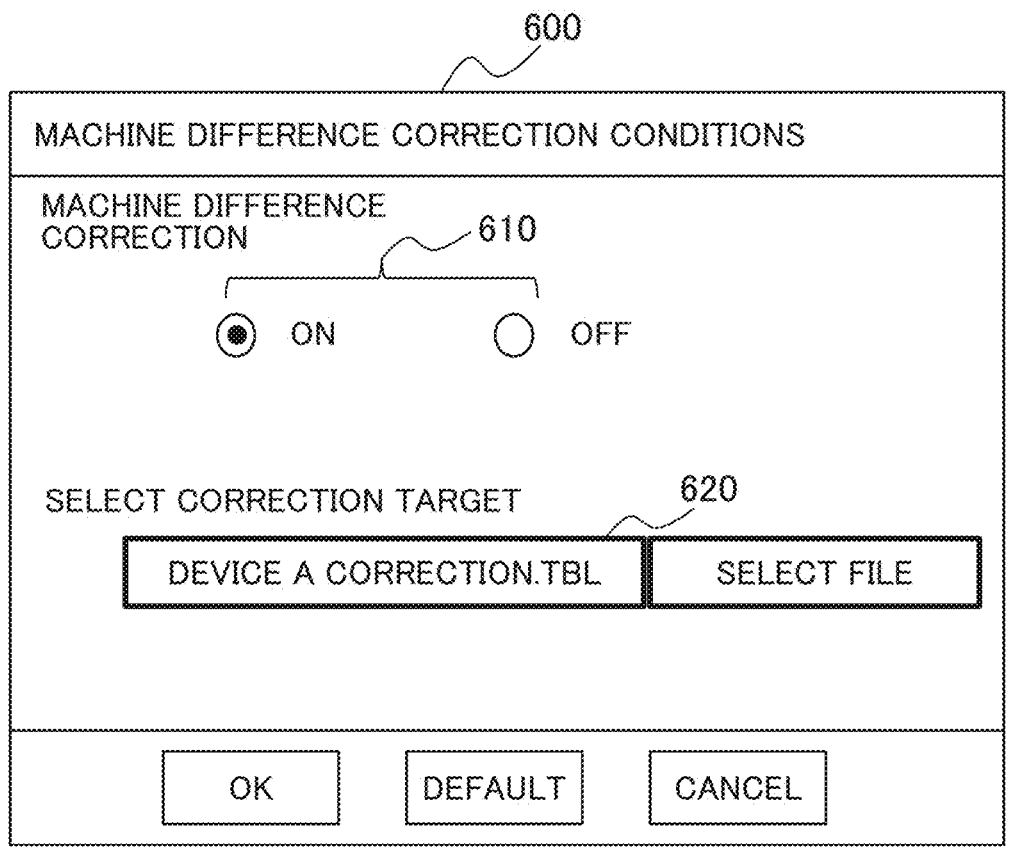
FIG. 9 is a GUI schematic diagram illustrating the first embodiment of the present invention and an image correction setup screen.

FIG. 9 illustrates a GUI (Graphical User Interface) to configure the environment for image correction. FIG. 9 exemplifies an environment setup screen 600 output to the image display device of the input/output portion 113. The setup screen 600 includes an ON/OFF switch 610 to specify whether to correct the machine difference and a correction target 620 to specify a device to be corrected.

When an image is captured, the switch 610 specifies whether to perform the image correction (machine difference correction). At this time, a file can be specified as the correction target 620 to determine which device provides the frequency characteristic as an adjustment target.

The correction target 620 specified on the environment setup screen 600 is regarded as a file that records the frequency characteristics of correction targets. The use of the environment setup screen 600 as described in the first embodiment makes it possible to determine whether to correct images and freely specify correction targets. The GUI can share the display portion of the input/output portion 113.

As above, according to the example of FIG. 5, device A as the reference captures multiple specifically patterned specimens to acquire multiple images. For example, the Fourier transform is used to acquire a spatial frequency characteristic of each of the images. The spatial frequency characteristics are statistically processed to acquire spatial frequency characteristic A for device A.

Then, different device B captures multiple specimens using the same pattern as those used for device A to acquire multiple images. For example, the Fourier transform is used to acquire a spatial frequency characteristic of each of the images. The spatial frequency characteristics are statistically processed to acquire spatial frequency characteristic B for device B.

Spatial frequency characteristic A and spatial frequency characteristic B are compared to calculate a correction factor for image correction based on frequencies. The machine difference between device A and device B is reduced by correcting the image captured on either device so that no difference occurs between spatial frequency characteristic A and spatial frequency characteristic B. Experiments have shown that a difference in length measurement values can be reduced by maintaining the same frequency characteristics between the devices. It is possible to reduce the machine difference among devices and accurately manage operations at a site that uses multiple devices.

It is advantageous that the length measurement is practically performed on the specimen 108 using the same pattern described above. However, another pattern may be used under the condition that frequency components contained in the image are similar to those of an image used for the length measurement. The specimen used to calculate the correction factor and the specimen used for length measurement may or may not be identical.

Second Embodiment

The first embodiment has described the method for reducing the machine difference between two devices A and B. Advantageously, the image of device A as the reference contains components at as high a frequency as possible.

The fact that the image does not contain high-frequency components signifies that the image is unclear. The fact that the image contains many high-frequency components signifies that the image is clear. Therefore, multiple devices capture images of the same pattern (specimen 108) and compare frequency components of the images. The device containing the largest number of high-frequency components is assumed to be the reference device. It is thereby possible to correct images captured by other devices to be clearer and reduce the machine difference.

Figure 4A:
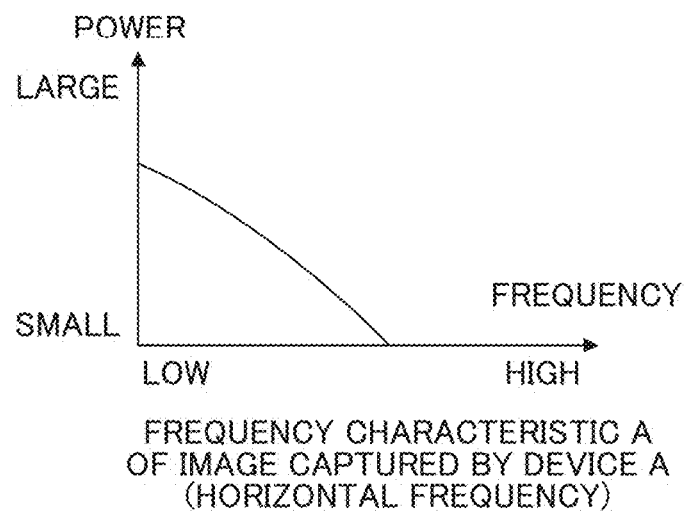
FIG. 4A is a graph illustrating a second embodiment of the present invention and frequency characteristics of device A.
Figure 4B:
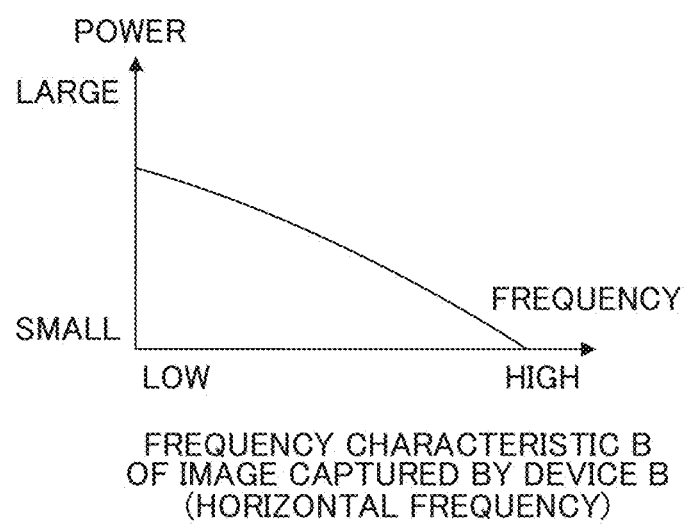
FIG. 4B is a graph illustrating the second embodiment of the present invention and frequency characteristics of device B.

FIGS. 4A and 4B are graphs illustrating frequency characteristics. FIG. 4A is a graph illustrating frequency characteristic A of device A. FIG. 4B is a graph illustrating frequency characteristic B of device B. Frequency characteristics A and B in the illustrated example show the relationship between the frequency and the power (amplitude) but are not limited thereto.

FIGS. 4A and 4B show only the power with respect to the horizontal frequency, for the sake of explanation. As seen from the drawings, the image acquired by device B keeps the power at higher frequencies than the image acquired by device A. In such a case, image processing can be performed so that device B is used as the reference device and device A is adjusted to device B.

Availability of the power at high frequencies can be determined by existing techniques such as checking intensities of the power corresponding to high-frequency characteristics or comparing intensities of outputs from high-pass filters.

Figure 10:
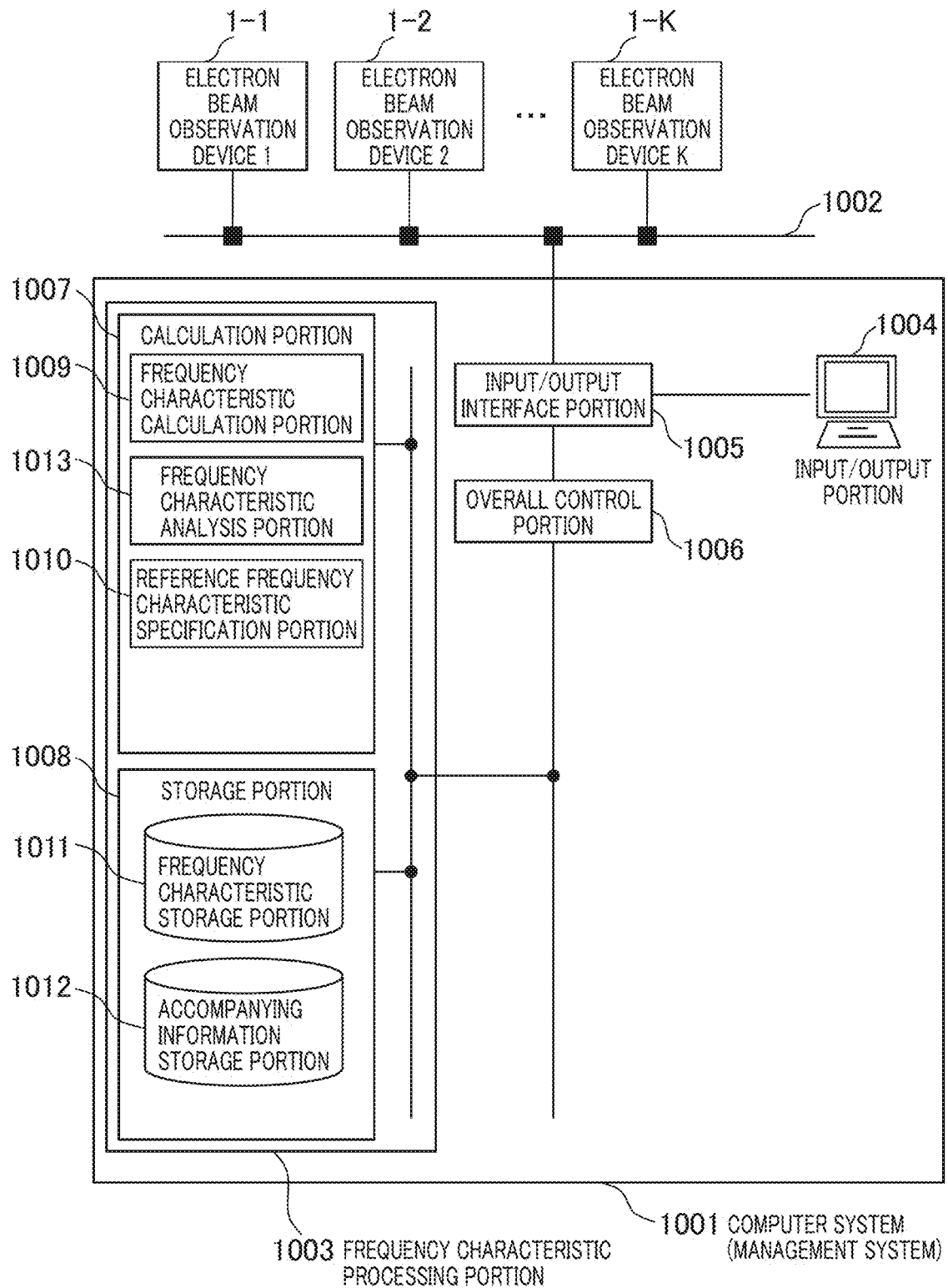
FIG. 10 is a configuration diagram illustrating the second embodiment of the present invention and an electron beam observation system to manage multiple electron beam observation devices.

FIG. 10 is a diagram illustrating a schematic configuration of the electron beam observation system according to the second embodiment. A computer system (management system) 1001 connects with as many as K (K≥2) electron beam observation devices illustrated in FIG. 1 via communication means 1002 such as a data bus or network. The computer system 1001 uses a frequency characteristic processing portion 1003, an input/output interface portion 1005, and an overall control portion 1006 as needed. The frequency characteristic processing portion 1003 performs processing related to frequency characteristics and saves frequency characteristics and the accompanying information. The input/output interface portion 1005 transfers frequency characteristic data via an input/output portion 1004 or the communication means 1002. The overall control portion 1006 can also control the electron beam observation devices.

The frequency characteristic processing portion 1003 includes a calculation portion 1007 and a storage portion 1008. The calculation portion 1007 performs operations related to frequency characteristics. The storage portion 1008 saves information. The storage portion 1008 uses a frequency characteristic storage portion 1011 and an accompanying information storage portion 1012 as needed. The frequency characteristic storage portion 1011 stores the frequency characteristics acquired by the electron beam observation devices. The accompanying information storage portion 1012 stores accompanying information such as image capture conditions for each frequency characteristic. The accompanying information is acquired from each electron beam observation device along with the frequency characteristic. The calculation portion 1007 uses a frequency characteristic calculation portion 1009, a frequency characteristic analysis portion 1013, and a reference frequency characteristic specification portion 1010 as needed. The frequency characteristic calculation portion 1009 performs operations on frequency characteristics acquired by the electron beam observation devices and frequency characteristics stored in the frequency characteristic storage portion 1011. The frequency characteristic analysis portion 1013 analyzes the frequency characteristics. The reference frequency characteristic specification portion 1010 specifies the frequency characteristic that serves as the basis for adjusting the machine difference.

The computer system 1001 has the function of receiving input of frequency characteristics acquired by the electron beam observation devices and outputting a result of calculating the frequency characteristics and the frequency characteristic as a reference, for example, to the input/output portion 1004. The input/output portion 1004 is configured to display data for the operator and accept input from the operator through the use of a keyboard, a mouse, and a display device, for example.

The computer system 1001 can allow the storage portion 1008 to store the frequency characteristic used as the reference to adjust the machine difference according to the present invention. The computer system 1001 can transmit the reference frequency characteristic to devices 1-1 to 1-K in response to a request from each of the devices. The devices 1-1 to 1-K can transmit any of the frequency characteristics of images captured by each device to the computer system 1001. The computer system 1001 can acquire any frequency characteristic attributed to each device via communication means 1002 and specify the frequency characteristic as a reference from the frequency characteristics of the devices. Each device performs a process that adjusts the frequency characteristic of a captured image to the reference frequency characteristic.

Each of devices 1-1 to 1-K calculates a correction factor from the reference frequency characteristic acquired from computer system 1001 and the frequency characteristic of an image captured by each of devices 1-1 to 1-K and corrects the image using the correction factor. The correction factor in device 1-K can be calculated as follows.

Correction factor=Reference frequency characteristic/
Frequency characteristic of device 1-$K$ (Equation 2)

Figure 21:
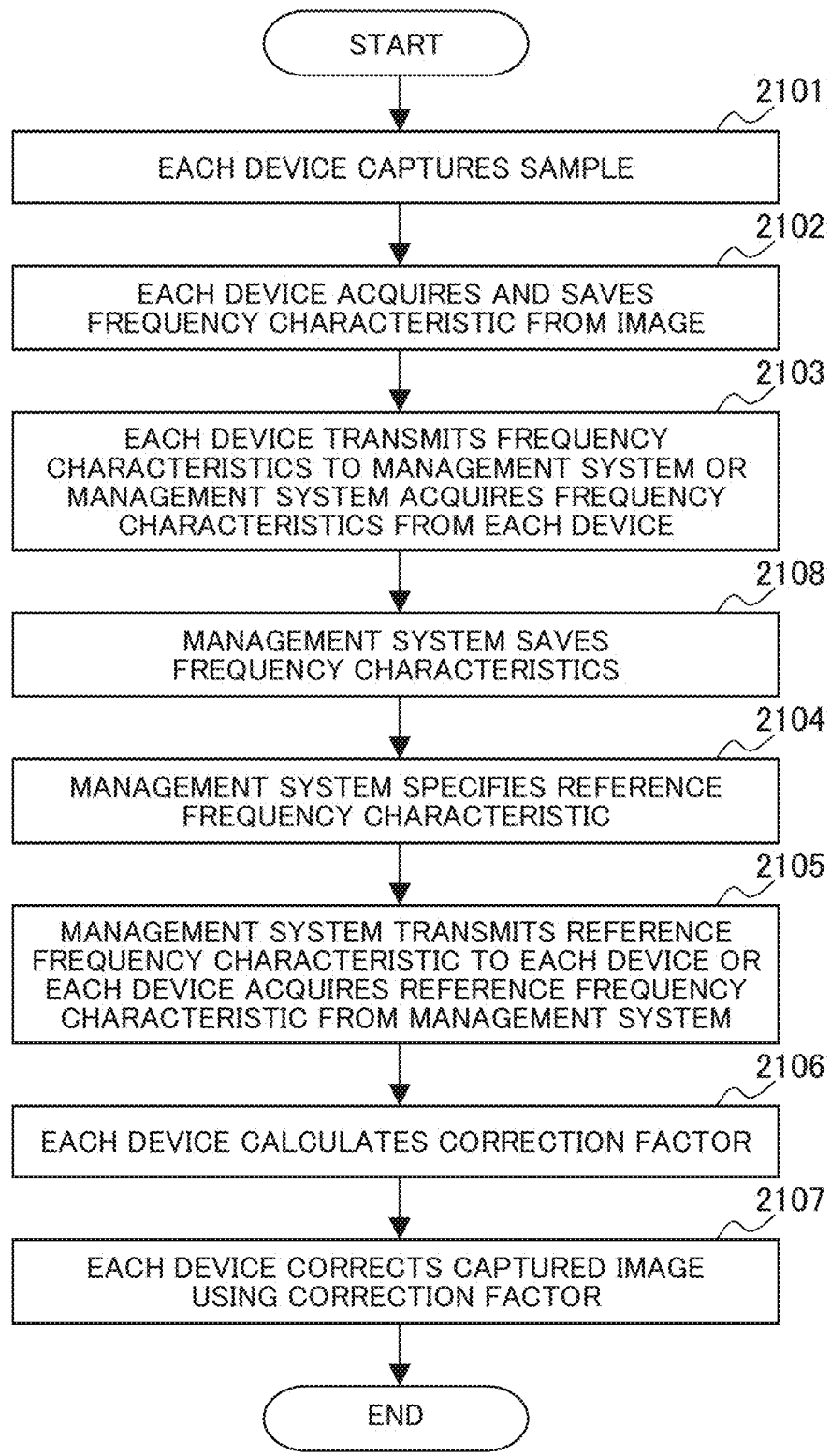
FIG. 21 is a flowchart illustrating the second embodiment of the present invention and an image correcting method.

FIG. 21 illustrates a flowchart according to the second embodiment. Each of devices 1-1 to 1-K captures an SEM image of the specifically plated specimen (reference specimen) (2101), acquires the corresponding frequency characteristic from the captured image via the calculation portion 112 or the image processing portion 148, and saves the frequency characteristic in the storage portion 111 (2102). Devices 1-1 to 1-K then transmit the respective frequency characteristics to the computer system 1001 (2103). The computer system 1001 may acquire a targeted frequency characteristic saved in the storage portion 111 of each device (2103). The computer system 1001 saves the frequency characteristics along with the accompanying information in the frequency characteristic storage portion 1011 and the accompanying information storage portion 1012 (2108). The reference frequency characteristic specification portion 1010 of the calculation portion 1007 of the computer system 1001 specifies the reference frequency characteristic from the frequency characteristics saved in the storage portion 1008 (2104). Advantageously, the reference frequency characteristic contains as high a frequency component as possible. The frequency characteristic analysis portion 1013 can analyze frequency characteristics. The computer system 1001 transmits the specified reference frequency characteristic to devices 1-1 to 1-K (2105). Each device may acquire the reference frequency characteristic from the computer system 1001 (2105). Each device uses (Equation 2) to calculate a correction factor based on the reference frequency characteristic and the frequency characteristic of the image of the specifically patterned specimen (reference specimen) captured by each device (2106).

Each device uses the correction factor to correct the image captured by each device (2107).

The second embodiment can reduce machine differences among multiple devices 1 and accurately manage operations on an electron beam observation system that includes multiple devices 1.

Each of devices 1-1 to 1-K may calculate and maintain a number sequence that expresses the frequency characteristic. For example, the amplitude of a two-dimensional FFT can be used as the number sequence that expresses the frequency characteristic.

Third Embodiment

The present invention does not necessarily require adjusting machine differences based on one specific reference device. The reduction of machine differences requires only frequency characteristics of images. Therefore, it is also possible to capture a specific pattern (reference specimen) on multiple devices, find the reference frequency characteristic by averaging frequency characteristics of the images and calculate a correction factor by using the reference frequency characteristic.

According to the third embodiment, the computer system 1001 uses the frequency characteristic of each device to calculate an average value (average frequency characteristic) of frequency characteristics in the computer system of the electron beam observation device illustrated in FIG. 10. In this case, a correction factor in device 1-K is calculated as follows.

Correction factor=Reference frequency characteristic/
Frequency characteristic of device 1-$K$=Average
frequency characteristic of each device (average
frequency characteristic)/Frequency characteristic of device 1-$K$ (Equation 3)

Figure 22:
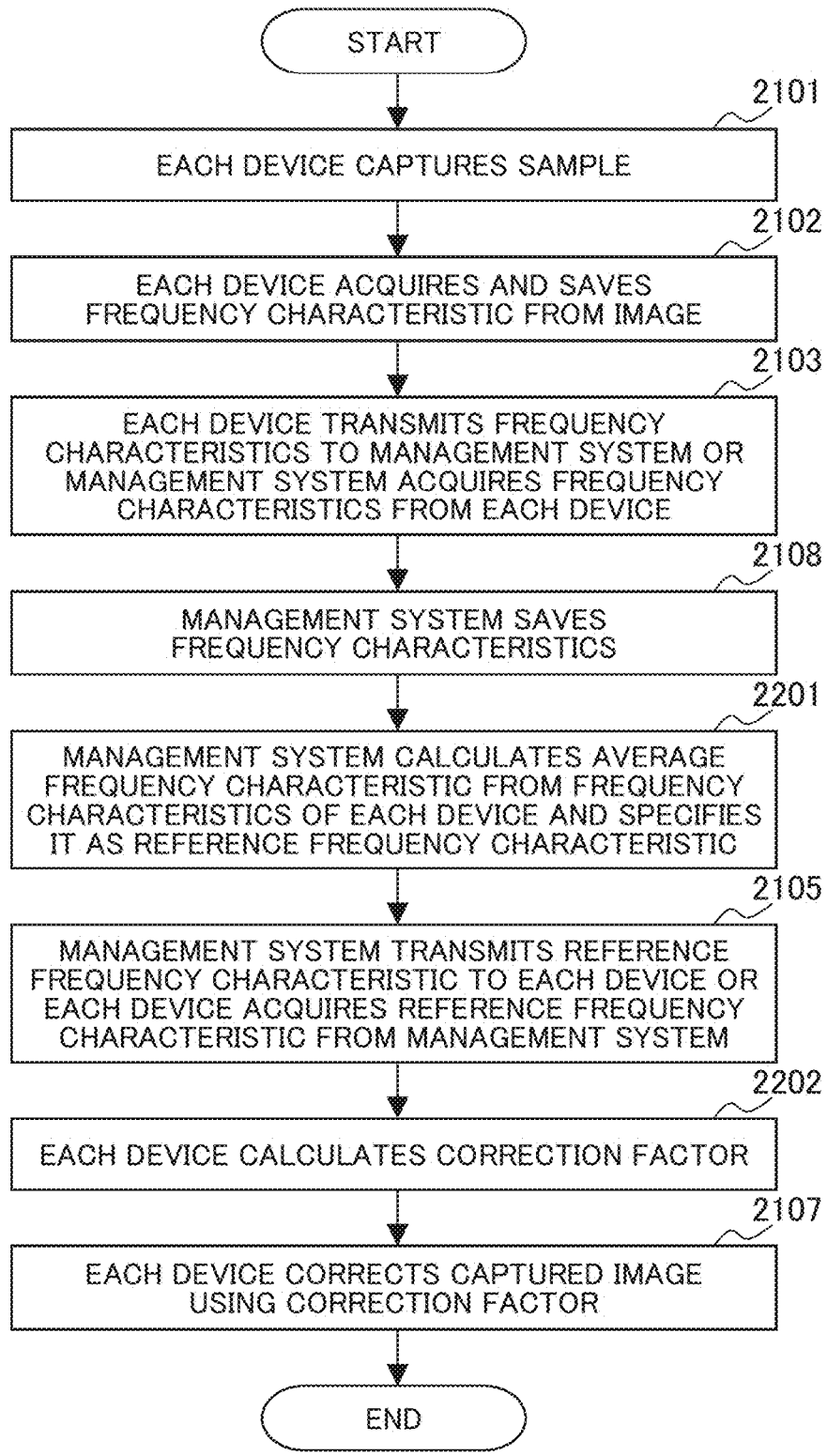
FIG. 22 is a flowchart illustrating the third embodiment of the present invention and an image correcting method.

FIG. 22 illustrates a flowchart according to the present embodiment. The computer system 1001 saves the frequency characteristic of each device in the storage portion 1008 (2108). Then, the frequency characteristic calculation portion 1009 of the calculation portion 1007 calculates an average value (average frequency characteristic) of frequency characteristics for the devices and specifies the average frequency characteristic as a reference frequency characteristic (2201). Each device uses (Equation 3) to calculate a correction factor based on the reference frequency characteristic and the frequency characteristic of the specifically patterned specimen (reference specimen) of images captured by each device (2202). The other steps are similar to those in FIG. 21.

The third embodiment makes it possible to reduce machine differences among multiple devices 1 and accurately operate and manage the electron beam observation system having multiple devices 1. Multiple devices can be handled as a reference device group by using an average value (average frequency characteristic) of frequency characteristics of the devices as the reference frequency characteristic. It is possible to flexibly operate and manage the machine difference correction (image difference correction) in the electron beam observation system.

Fourth Embodiment

As described in the third embodiment, the reduction of machine differences requires only frequency characteristics of images. Therefore, the differently structured electron beam observation devices 1 may capture images. Each device can capture the specifically patterned specimen 108 and calculate a correction factor based on the frequency characteristic of the image.

When the frequency characteristic of the image is saved, even the same device can be used to detect chronological changes (aging) of electron beams. It is possible to reduce chronological changes of the electron beam by correcting images. When the maintenance needs to replace parts, for example, the image correction can reduce changes in electron beam shapes due to the replacement of the aperture plate 154 or the electron source 101.

Fifth Embodiment

As described in the first embodiment, it is possible to reduce the effect of electron beam shape differences on an image based on the frequency characteristic of an image acquired from the captured image. The first embodiment performs the image correction to reduce machine differences among the devices. Moreover, suppose the same device includes multiple aperture plates 154 and switches between the aperture plates 154. In such a case, the image correction can also be used to adjust the frequency characteristic of an image captured by another aperture plate 154 to the frequency characteristic of an image captured by the specific aperture plate 154.

Throughout the present specification, optical conditions cover all design and setup conditions to determine the shape of an electron beam irradiated onto the specimen 108. The conditions include aperture shapes, electron beam energy reaching the specimen, opening angles on the specimen 108, the amount of current applied to the specimen, and optical magnifications, for example. The fifth embodiment will describe an example of changing only aperture shapes.

For example, the present embodiment can apply to a case where there is a difference between an aperture shape to prioritize resolutions and an aperture shape appropriate for capturing the specimen 108 containing deep grooves. The aperture shape to prioritize resolutions is used to capture one or more images to acquire frequency characteristics of images when that aperture is used. The same pattern is changed to the aperture for deep groove capturing. Then, one or more images are captured to acquire frequency characteristics of images.

Like the first embodiment, it is advantageous to calculate a correction factor that reduces a difference in frequency characteristics acquired from the images. Then, the subsequent image capture can correct the frequency characteristic of an image captured with one aperture to the frequency characteristic of an image captured with the other aperture.

Sixth Embodiment

The correction factor calculation and the image correction may use different enlargement factors (magnifications) of the electron beam observation device 1. The correction factor includes a frequency-based factor. Therefore, the correction factor can be appropriately scaled in the frequency direction based on the ratio between the magnification for correction factor calculation and the magnification for image correction. The image correction can be performed thereafter.

The frequency-based factor includes the frequency, the intensity (amplitude or power), and the phase on a pixel basis. The sixth embodiment uses no phase. Therefore, the phase can be excluded.

Seventh Embodiment

The seventh embodiment will describe an example of calculating multiple correction factors and averaging the correction factors.

The fifth embodiment has described the example of calculating the correction factor to correct the frequency characteristic of an image captured with a specific aperture shape (aperture shape A) to the frequency characteristic of an image captured with another aperture shape (aperture shape B).

The seventh embodiment prepares and averages multiple correction factors to reduce the effect of value variations due to noise, for example. The method is provided as a processing procedure illustrated in FIG. 6.

Figure 6:
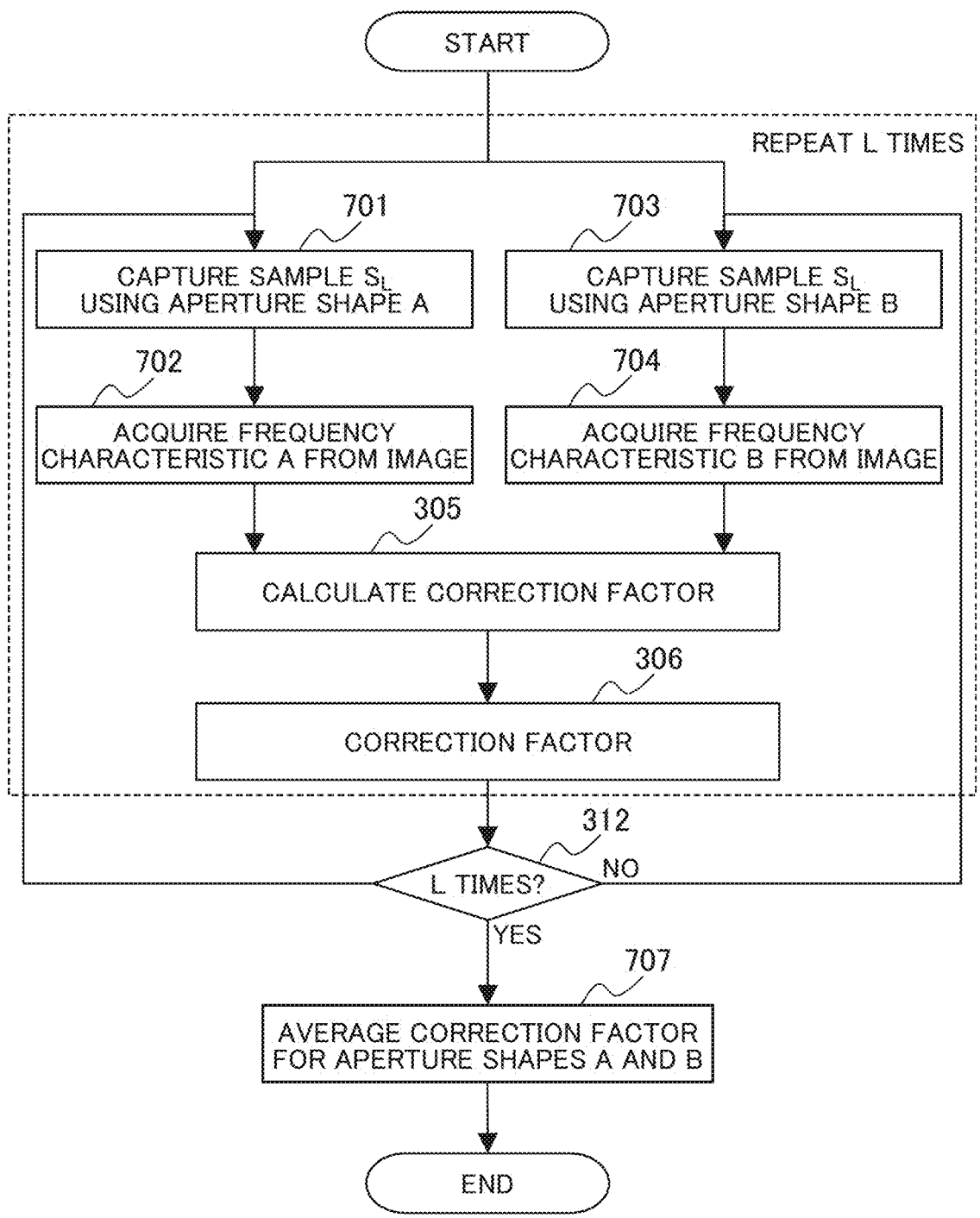
FIG. 6 is a flowchart illustrating a seventh embodiment of the present invention and a process to calculate a correction factor from frequency characteristics.

FIG. 6 is a flowchart illustrating the process of calculating a correction factor from the frequency characteristic. Device A captures an SEM image of the specifically patterned specimen 108 using aperture shape A (701) and calculates frequency characteristic A from the image (702).

Device B captures an SEM image of the specifically patterned specimen 108 using aperture shape B (703) and calculates frequency characteristic B from the image (704).

Device A acquires frequency characteristic B of device B and calculates the correction factor similarly to the first embodiment (306). The process repeats steps 701 to 704 and step 306 a specified number of times L (312), and then calculates an average correction factor, namely, an average value of the correction factors calculated at step 306 (707).

Differences from FIG. 5 of the first embodiment mentioned above are that device A differs from device B in aperture shape A and aperture shape B and the correction factors are calculated and then are averaged. Calculation of the correction factor (306) is repeated L times to find an average value that is then used as an average correction factor 707 for aperture shape A and aperture shape B. This makes it possible to suppress the influence of value variations.

Eighth Embodiment

The eighth embodiment describes an example of using the same device and the same aperture shape and calculating a correction factor from frequency characteristics of images captured under optical conditions other than multiple aperture shapes.

The above-described fifth embodiment has described that the frequency characteristic of an image captured through the use of one aperture shape can be corrected to the frequency characteristic imaged through the use of the other aperture shape. However, the same device and the same aperture shape also make it possible to correct the frequency characteristic of an image captured under a given optical condition to the frequency characteristic of an image captured under a different optical condition.

For example, as one optical condition, a small-current mode gives preference to the resolution over an irradiation current. As the other optical condition, a large-current mode gives preference to a large irradiation current over the resolution. The same device and the same aperture shape are used to capture images of the same pattern in the small-current mode and the large-current mode in terms of frequency characteristics of captured images like the fifth embodiment to acquire a correction factor. The frequency characteristic of the image captured in the large-current mode can be corrected to the frequency characteristic of the image acquired in the high-resolution mode.

Figure 7:
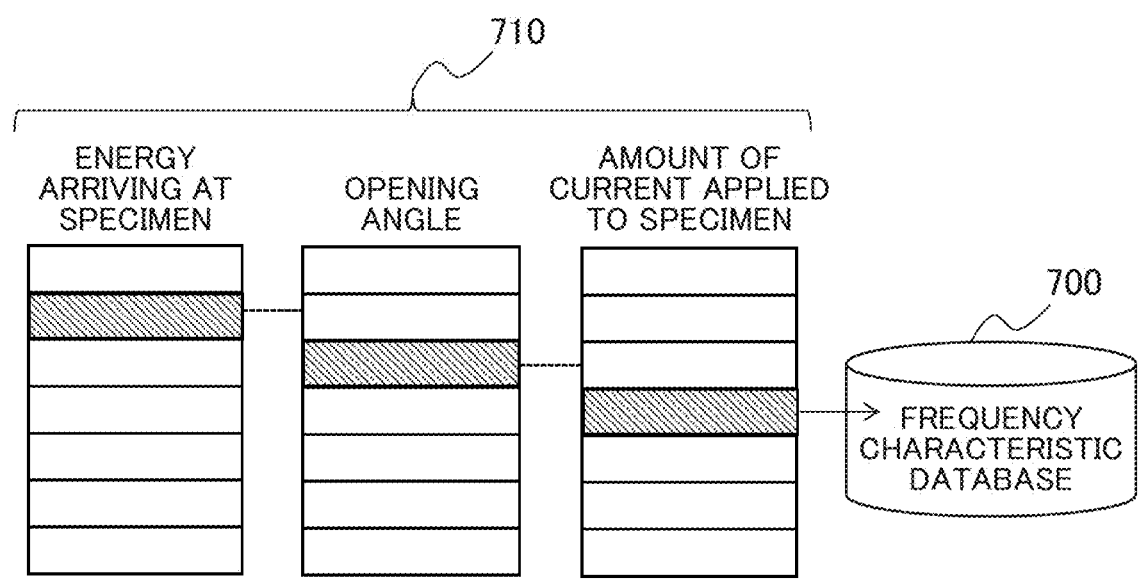
FIG. 7 is an explanatory diagram illustrating an eighth embodiment of the present invention and an image correcting method.

When the optical conditions are changed as above, a correction process links frequency characteristics of images corresponding to the optical conditions with an optical condition 710 and stores the frequency characteristics in the device as a database 700 as illustrated in FIG. 7. Consequently, the device 1 can read data corresponding to the optical condition 710 for the frequency characteristic of an image to be corrected and data corresponding to the optical condition 710 for the frequency characteristic of the corrected image from the database 700. The device 1 can then calculate a correction factor and correct the frequency characteristic of the image.

The correction may be made to images associated with an optical condition not existing in the database 700. In such a case, the correction factor may be calculated before the image capture and stored in the database 700. It may be favorable to estimate a corresponding correction factor from the image frequency characteristic associated with the approximate optical condition 710. These images use the same pattern that is acquired under the same image capture condition or the same dose amount of images. Data in the database 700 may be stored as correction factors.

Ninth Embodiment

The above-mentioned eighth embodiment has described that the correction factor can be calculated and corrected for the frequency characteristics of images captured under multiple optical conditions. The image brightness and SN ratios differ depending on the optical conditions. Therefore, a reference (image capture condition) may be provided for an image used for the calculation of the correction factor.

The image capture condition is assumed to be a condition for the image capture such as the size of an image to be captured or a frame integration count and a scanning speed to form a single image by integrating multiple captured images.

For example, suppose an image used to calculate the correction factor maintains the total dose amount of the image within a predetermined reference range under any optical conditions. The amount of current applied per pixel is small in the small-current mode. Therefore, the frame integration count can be increased. Meanwhile, the large-current mode provides a large amount of current applied per pixel but increases the risk of deforming the pattern due to adhesion of contamination applied to the surface of the specimen 108. Therefore, the frame integration count can be decreased to capture images.

The ninth embodiment has been described on the assumption of selecting the image capture condition satisfying the reference dose amount from the optical conditions provided before the image capture. It may be also favorable to capture images under any image capture conditions and then determine that an image outside the reference range is not used for the correction factor calculation.

Tenth Embodiment

The above-described eighth embodiment has described the example of using the database 700 to save frequency characteristics of images corresponding to the optical condition. The tenth embodiment will provide an example of identifying and excluding an error image from the images saved in the database 700.

Figure 8:
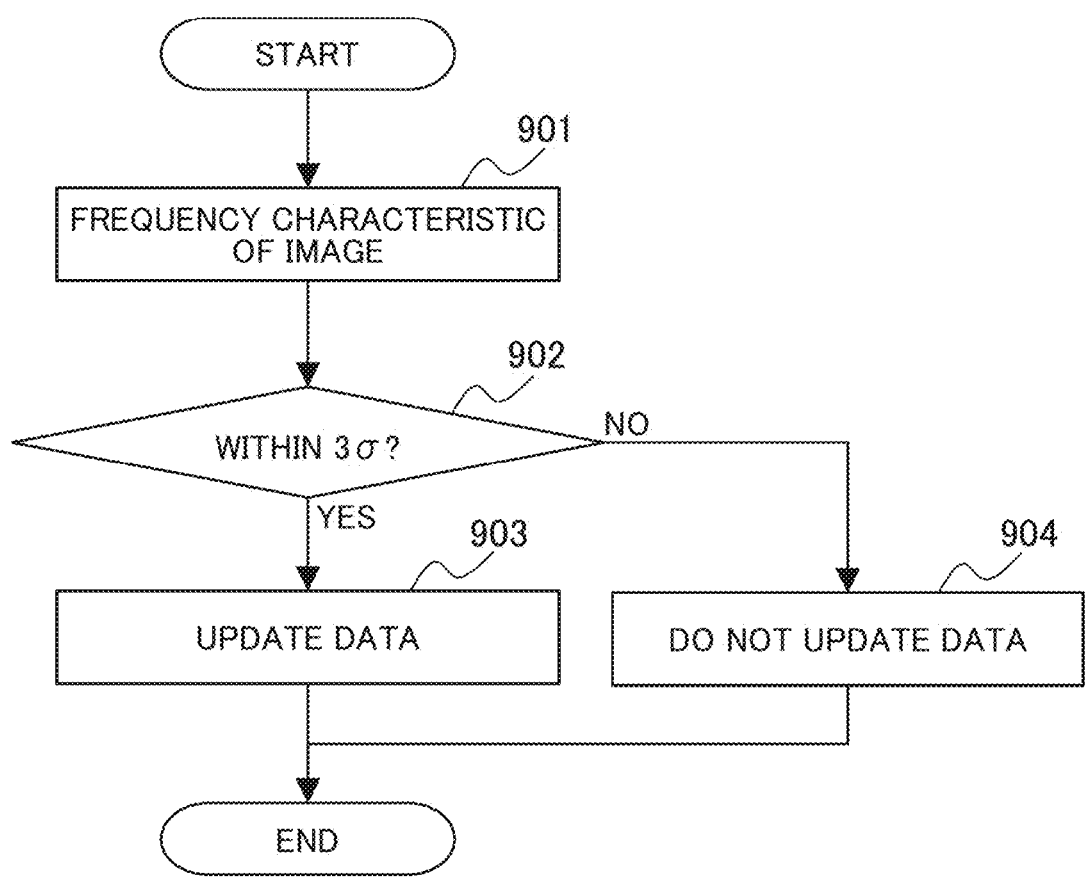
FIG. 8 is a flowchart illustrating a tenth embodiment of the present invention and data update.

FIG. 8 is a flowchart illustrating a process for device A to update data. The data in the database 700 may be updated each time the optical conditions are changed. In this case, an acquired image may be distorted due to noise or disturbances, for example. A possible solution is to accumulate past data and maintain the averaged frequency characteristic value as a reference value, for example. The process then determines whether the most recently acquired frequency characteristic (901) satisfies standard deviation 3σ as the reference value (902). If the frequency characteristic is identified within the range, the process updates the data (903). If the frequency characteristic is identified outside the range, the process excludes the data as not being an update target (904). The reference value for the determination is not limited to this example.

Eleventh Embodiment

Figure 14A:
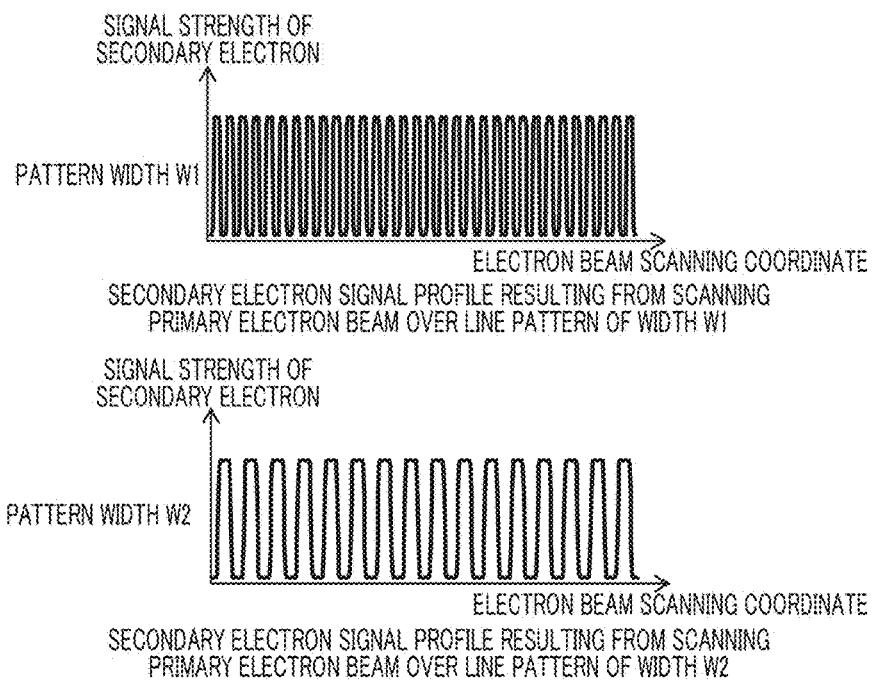
FIGS. 14A and 14B are explanatory diagrams illustrating an eleventh embodiment of the present invention and correction factors.
Figure 14B:
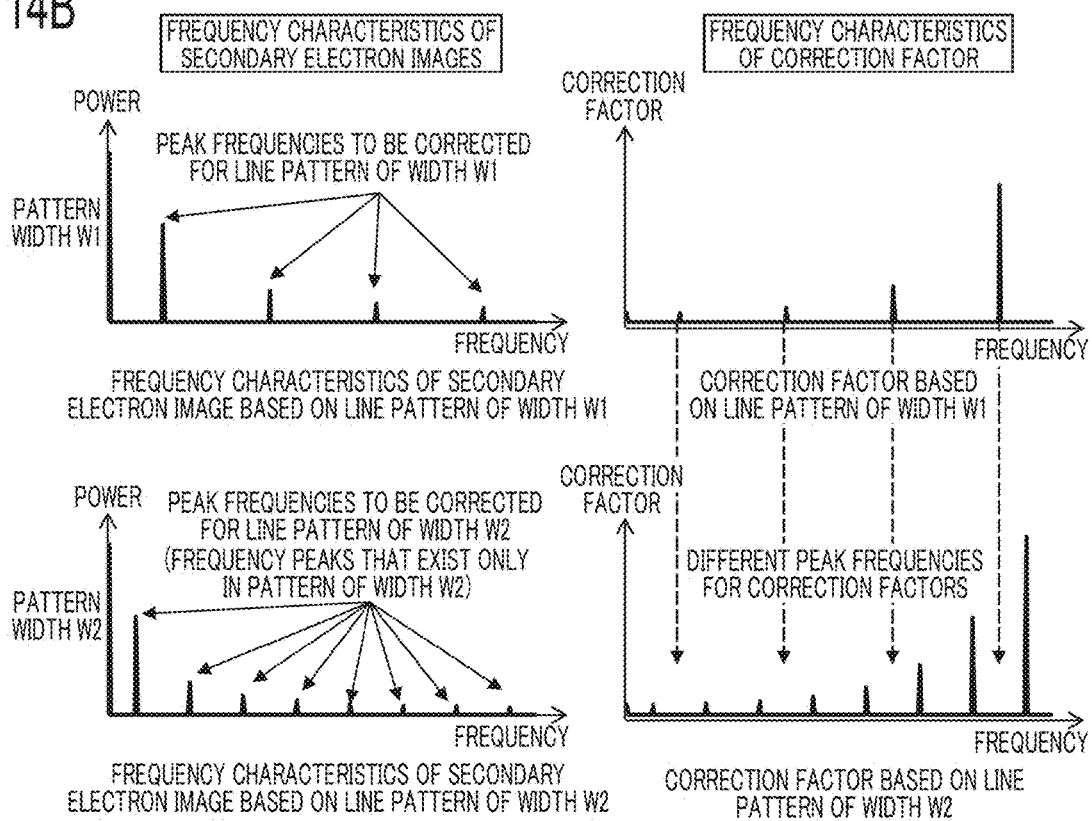

The present embodiment will explain a method for calculating a correction factor that can be commonly used for multiple specimens having different pattern shapes or pattern sizes. As an example, FIG. 14 (A) concerns a case of acquiring secondary electron images of multiple line patterns formed on a specimen based on pattern width W1 and pattern width W2 and illustrates signal profiles (signal waveforms) of a secondary electron resulting from scanning a primary electron beam in the direction perpendicular to the direction of extending the line patterns. FIG. 14 (B) illustrates the frequency characteristic in the secondary electron image according to the above-described line pattern (specimen) and the frequency characteristic of the correction factor acquired for the above-described line pattern (specimen) according to the flowchart as illustrated in FIG. 2, for example. As illustrated in FIG. 14 (B), the line pattern using different pattern widths causes different frequency characteristics of a signal generated from scanning the electron beam over the pattern. Therefore, the frequency to be corrected (peak frequency) differs. Consequently, a problem (issue) occurs as follows. Suppose a correction table is calculated from the specimen formed with a pattern of pattern width W1. Even if this correction table is applied to a specimen formed with a pattern of pattern width W2, it is impossible to correct components corresponding to the frequency peaks that exist only in pattern W2. Such a problem occurs due to differences in not only the pattern width of the line pattern but also the size (measure) of the pattern. Ideally, it is favorable to create a correction factor table using a pattern that enables signals to exist all over the frequency band. However, the semiconductor patterns of actual specimens are formed of line/space or hole patterns based on specific cyclic structures. Only the frequency representing pattern shapes shows the peak in the frequency space. It is difficult to create an ideal correction factor table that corrects the entire frequency band. However, if it is possible to extract only machine difference components independent of pattern shapes, it is possible to correct captured images of other patterns differing in frequency characteristics.

Figure 15:
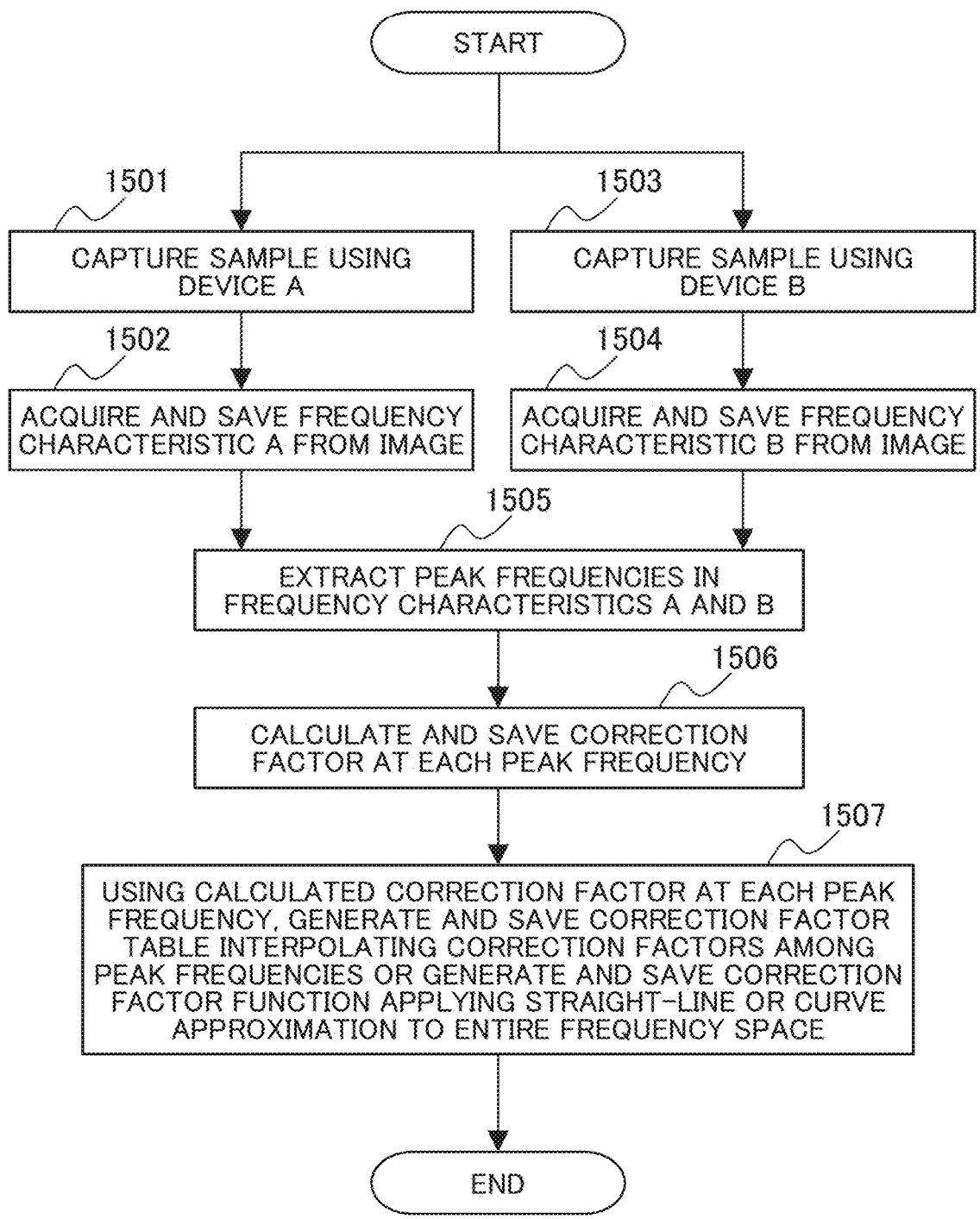
FIG. 15 is a flowchart illustrating the eleventh embodiment of the present invention and a process to calculate a correction factor from frequency characteristics.

With reference to a flowchart in FIG. 15, the description below explains an example of the method for calculating a correction factor table or correction factor function that can be commonly used for multiple patterns (specimens) differing in pattern sizes.

Device A as a reference device captures multiple (one or more) SEM images of the specimen (reference specimen) 108 of a line pattern using pattern width W1 (1501). Device A performs Fourier transform, for example, on each captured image to calculate and save frequency characteristic A of the image (1502). Similarly, device B captures multiple (one or more) SEM images of the specimen (reference specimen) 108 of a line pattern using pattern width W1 (1503). Device B performs Fourier transform, for example, on each captured image to calculate and save frequency characteristic B of the image (1504). It is favorable to use the line pattern with pattern width W1 for the same specimen.

The process extracts peak frequencies in frequency characteristics A and B (1505). The peak frequency can be selectively extracted from the maximum value of frequency components in a specific band or the frequency whose frequency component is greater than or equal to a predetermined threshold.

At the next step, the process calculates a correction factor at each peak frequency (1506). For example, suppose device A is used as the reference device and device B is adjusted to device A. Then, (Equation 1) is used to calculate a correction factor at each peak frequency.

Then, the calculated correction factor at each peak frequency is used to create a correction factor table interpolating correction factors among peak frequencies or a correction factor function applying straight-line or curve approximation to the entire frequency space (1507). The correction factor only at the peak frequency can correct only pattern shapes using pattern width W1. However, it is possible to interpolate the correction factors among peak frequencies. Alternatively, it is possible to use the correction factor at the peak frequency and create a correction factor function applying straight-line or curve approximation to correction factors in the entire frequency space. Consequently, it is possible to express changes in electron beam shapes in the entire frequency space. A targeted image can be corrected through the use of the correction factor table or the correction factor function. Thereby, it is possible to reduce a machine difference (image difference) among devices and an electron beam difference (image difference) in multi-beam devices or multi-column devices regardless of pattern shapes or pattern sizes.

Figure 11:
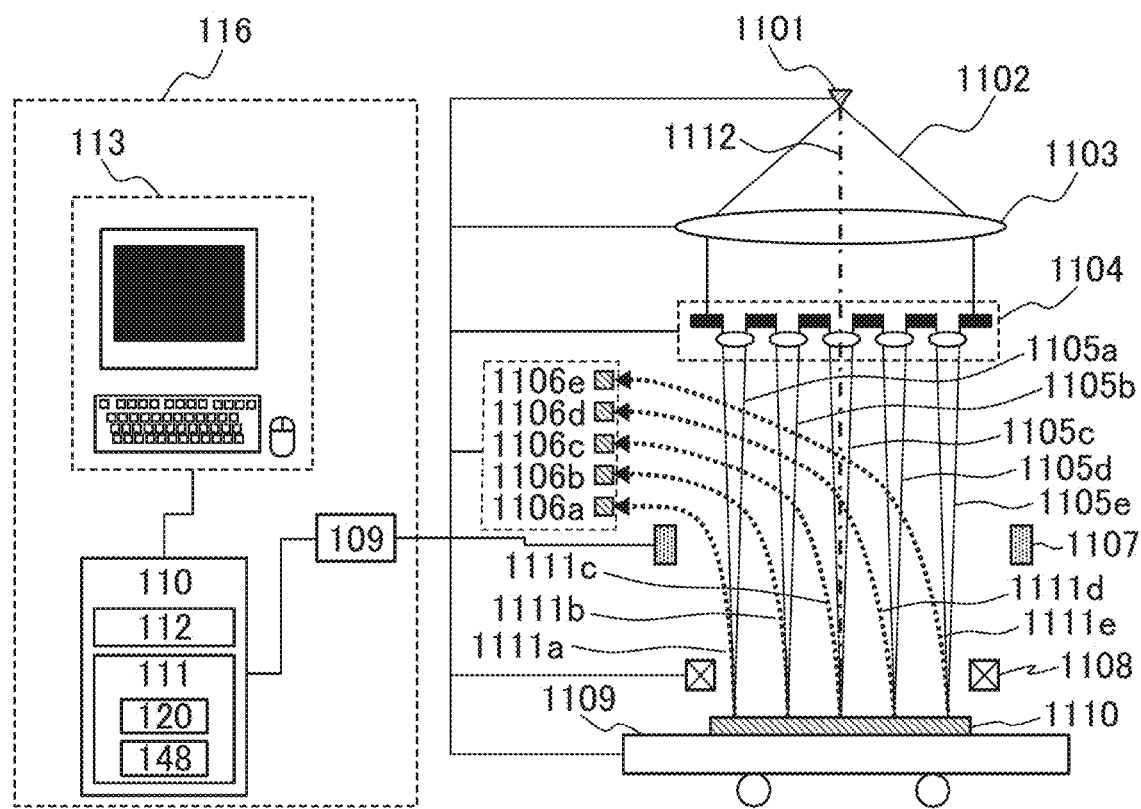
FIG. 11 is a block diagram illustrating an electron beam observation device according to a sixteenth embodiment.
Figure 12:
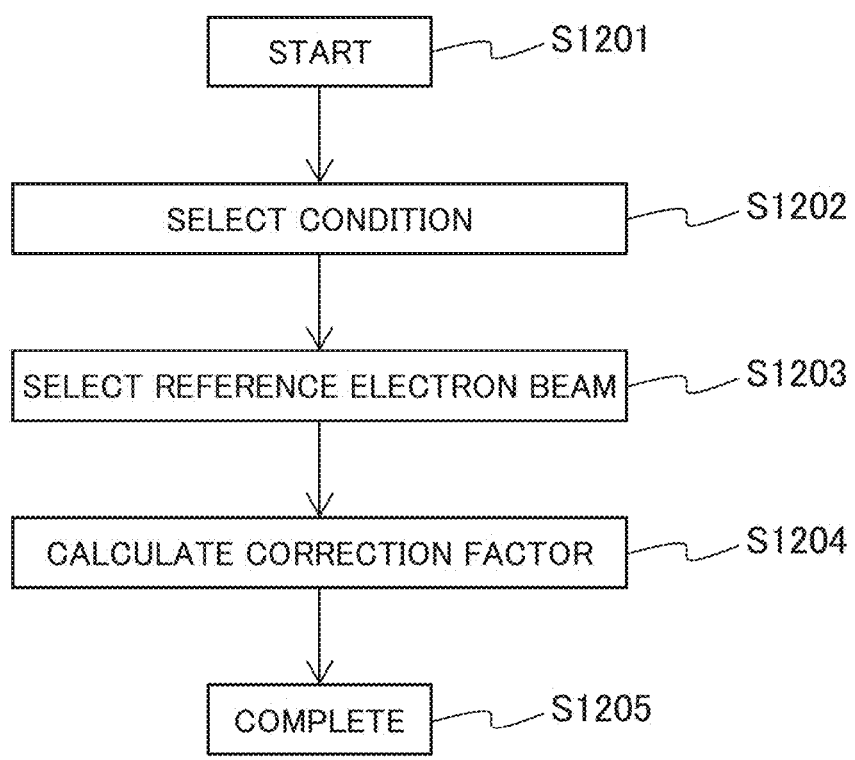
FIG. 12 is a flowchart to acquire a correction factor for electron beam difference reduction according to the sixteenth embodiment.
Figure 13:
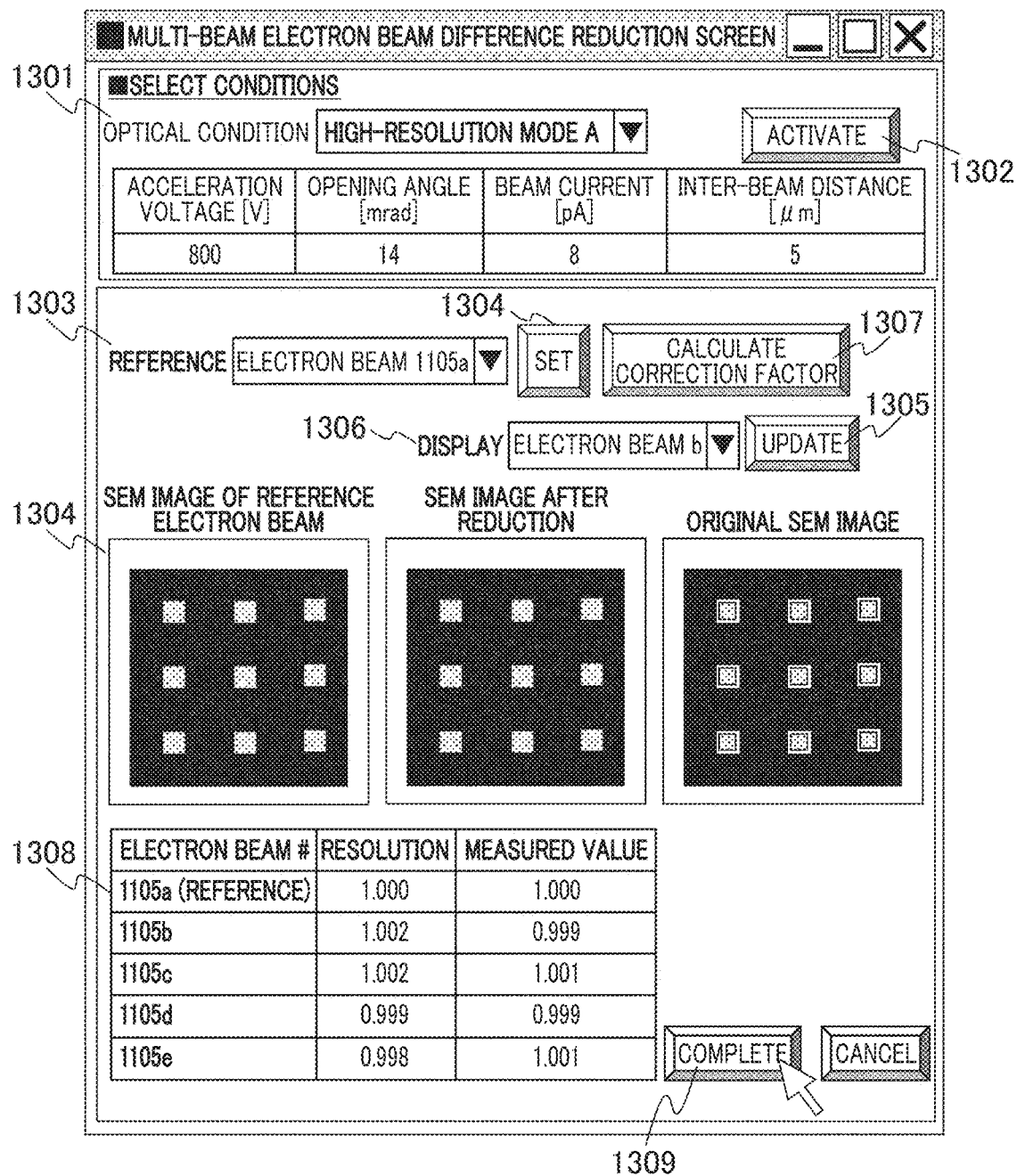
FIG. 13 illustrates a screen to acquire a correction factor for electron beam difference reduction according to the sixteenth embodiment.
Figure 19:
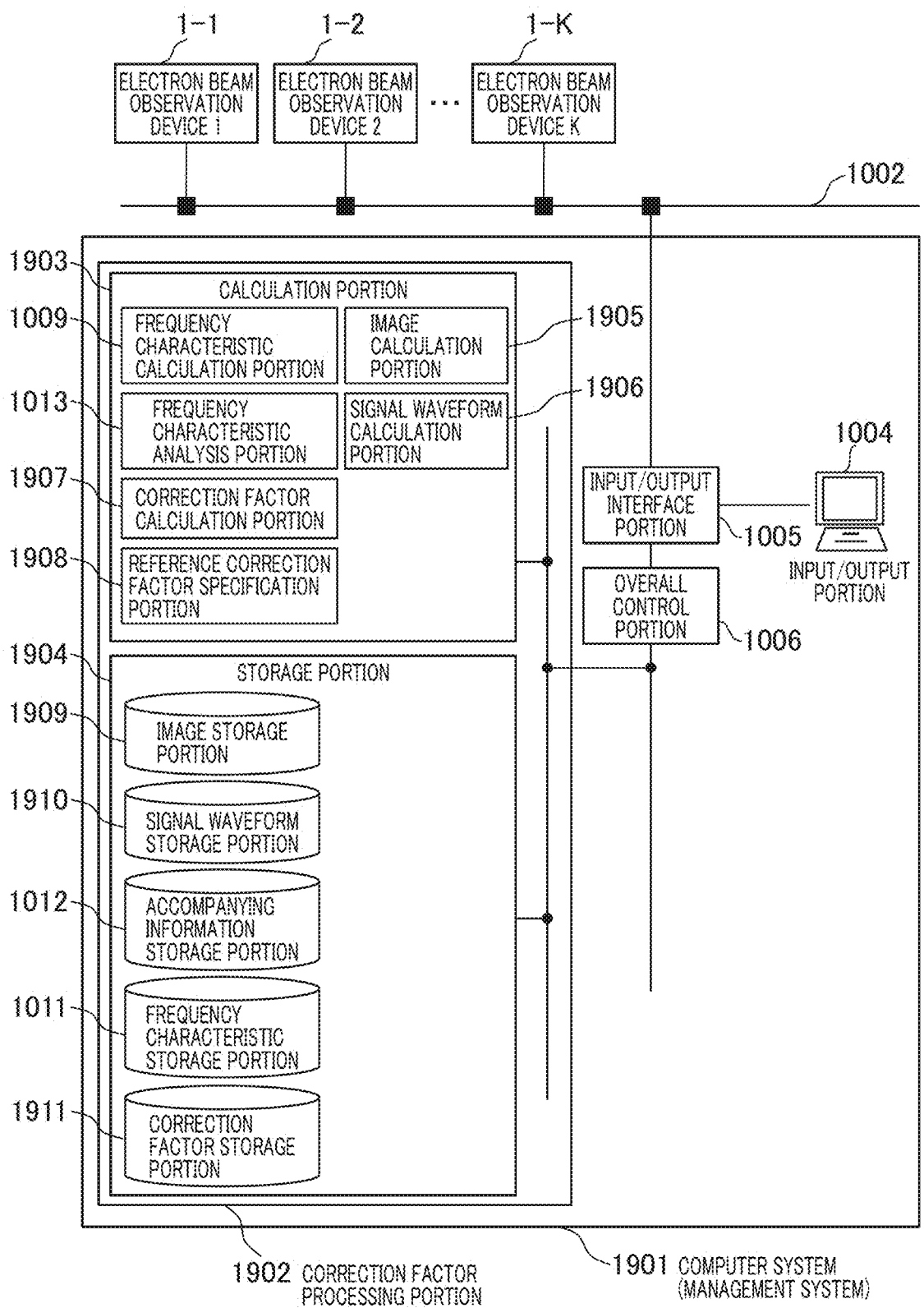
FIG. 19 is a flowchart illustrating a fifteenth embodiment of the present invention and an electron beam observation system.

The eleventh embodiment has described the example where device A acquires frequency characteristic B of device B and calculates the correction factor. However, device A may calculate frequency characteristic B of an image captured by device B. The frequency characteristic can be acquired from a single image. However, frequency characteristics of multiple captured images may be averaged to reduce an effect of value variations due to noise, for example. It may be favorable to perform a smoothing process on the calculated frequency characteristic to reduce variations of frequency characteristic values due to noise, for example. The correction factor calculation may use multiple images as illustrated by the flowchart in FIG. 5 or use an average value of correction factors in different aperture shapes as illustrated by the flowchart in FIG. 6. Moreover, the correction factor calculation may use the configuration of the electron beam observation system connected to the controller 1001 as illustrated in FIG. 10 or the configuration of the electron beam observation system connected to the computer system 1901 as illustrated in FIG. 19. Furthermore, the correction factor calculation may apply the eleventh embodiment to the multi-beam device or the multi-column device as illustrated in FIGS. 11 to 13. Without limitation to the above, the embodiment may be provided as a combination of the eleventh embodiment with the first through tenth embodiments described above or with twelfth through fourteenth embodiments described later. Correction factors may be interpolated by simply finding a straight line from two points forward and backward. The straight-line or curve approximation may use equations such as an exponential function that models changes in the electron beam shape. The exponential function can be used for the approximation if a blur difference between the reference device and a device to be corrected is caused by a difference in the width of a Gaussian shape of the electron beam.

Twelfth Embodiment

Figure 16A:
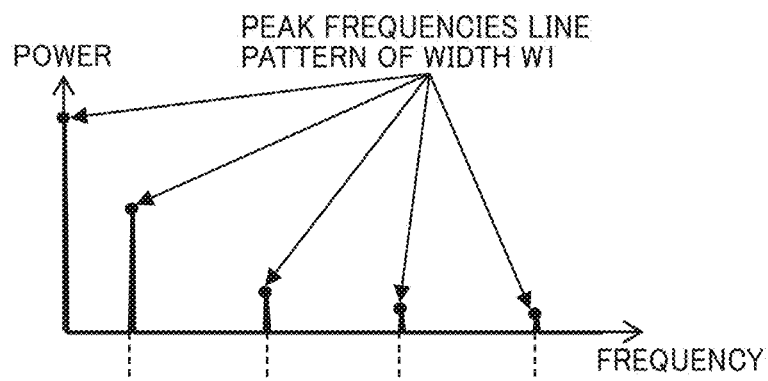
FIGS. 16A-16C are explanatory diagrams illustrating a twelfth embodiment of the present invention and an image correcting method.
Figure 16B:
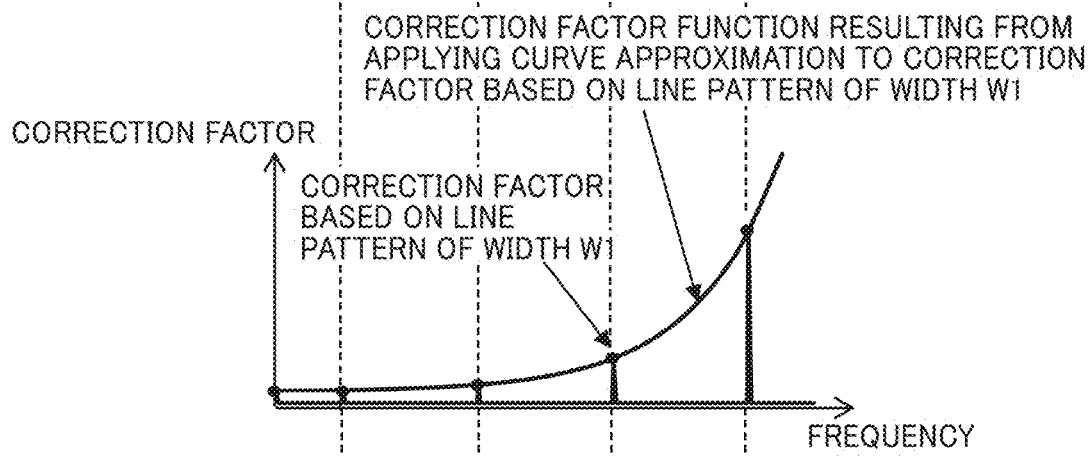
Figure 16C:
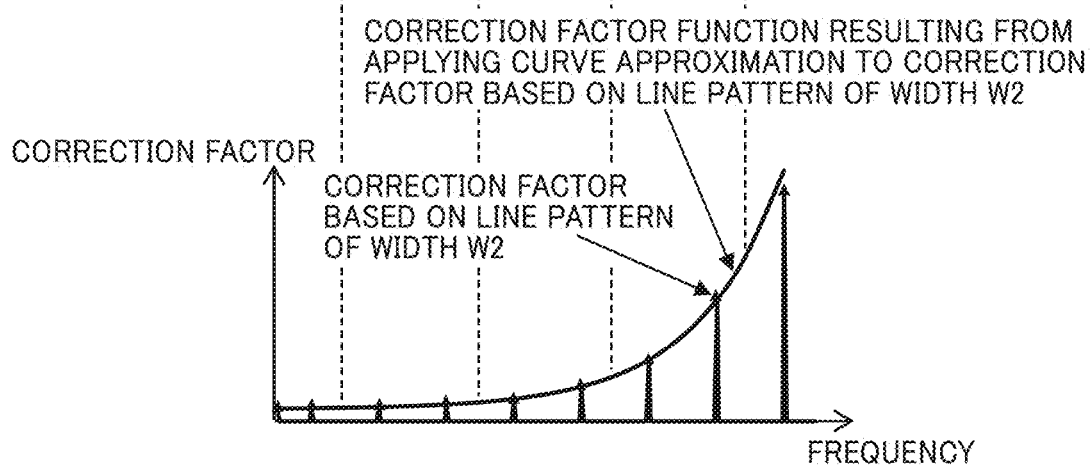

The twelfth embodiment will illustrate an image correction process with reference to FIG. 16. As above, when a signal acquired by scanning the pattern is expressed in the frequency space, the shape information about line/space or hole patterns is expressed by the frequency information mainly at the frequency peak. In other words, frequency bands other than the frequency peak are likely to contain almost no pattern shape information. In this case, it may be possible to correct a captured image using the correction factor only at the peak frequency or only in the proximate frequency band including the peak frequency. Then, it is possible to reduce the image difference due to a machine difference or a beam difference without correcting the other frequency bands. FIG. 16 (A) illustrates the frequency characteristic for a secondary electron image of multiple line patterns formed on the specimen having pattern width W1. FIGS. 16 (B) and (C) illustrate correction factors at peak frequencies and correction factor functions resulting from applying the curve approximation to the correction factors. The peak frequencies are calculated from line pattern images of widths W1 and W2 captured by the reference device and a device to be corrected. The shape information about the line pattern using width W1 is represented only by the peak frequencies indicated by black dots in FIG. 16 (B) and the frequency band near the peak frequencies. Therefore, it is possible to correct image differences without finding the correction factor function using the curve approximation. The peak frequencies in FIG. 16 (A) can be extracted by the method described in the eleventh embodiment. The correction factor is applicable through the use of only the peak frequency or its proximate band including the peak frequency. The present embodiment eliminates the need to create a correction factor function based on the curve approximation and apply the correction factor to the entire frequency space. Therefore, it is possible to reduce loads on the correction process and shorten the correction time. Comparison between FIG. 16 (B) and FIG. 16 (C) reveals that FIG. 16 (C) contains multiple peak frequencies not found in FIG. 16 (B). It is also possible to further reduce the image difference by properly using the correction factor function illustrated in FIG. 16 (B) or (C) according to the pattern shapes of images.

Thirteenth Embodiment

Figure 17A:
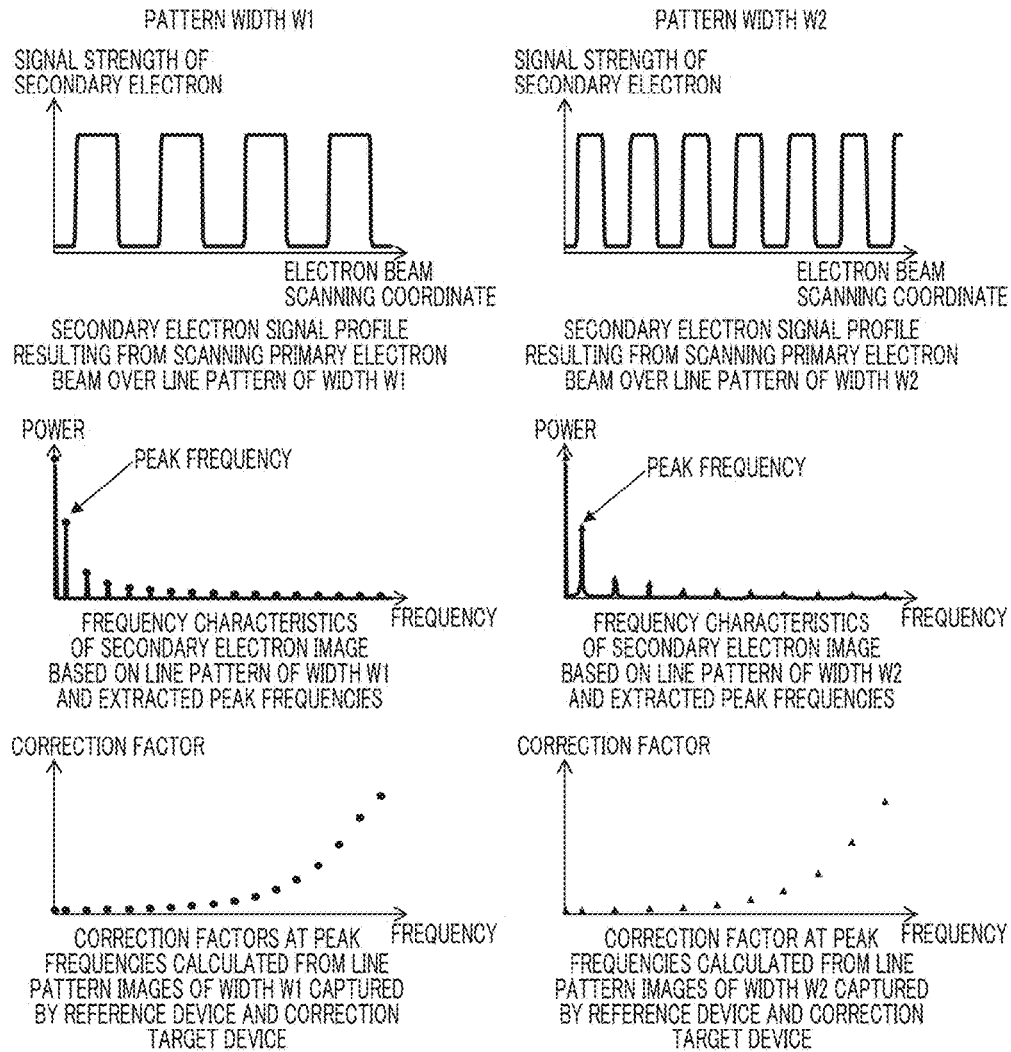
FIGS. 17A and 17B constitute a flowchart illustrating a thirteenth embodiment of the present invention and a process to calculate a correction factor.
Figure 17B:
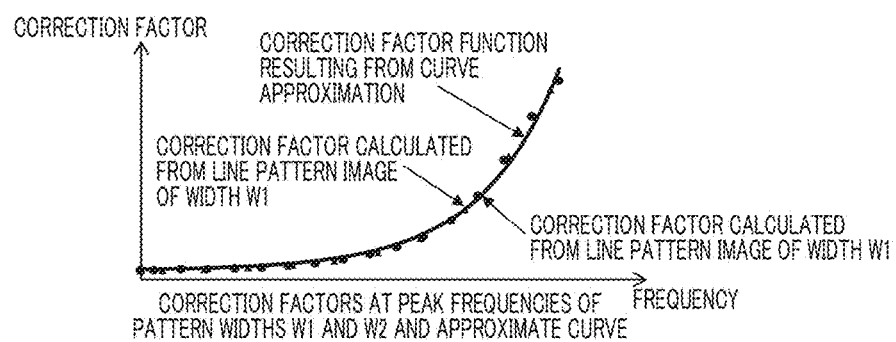

The present embodiment will describe a method for calculating the correction factor table or correction factor function using two or more specimens differing in pattern sizes. FIG. 17 (A) illustrates signal profiles of secondary electrons acquired by scanning a primary electron beam onto line patterns using pattern widths W1 and W2; frequency characteristics and extracted peak frequencies of secondary electron images based on line patterns using pattern widths W1 and W2; and correction factors at the peak frequencies calculated from line pattern images using widths W1 and W2 captured by the reference device and a correction target device. When the specimen pattern contains a small number of frequency peaks, for example, it is difficult to stably identify changes in the shape of the primary electron beam only from signals at the peak frequencies. In such a case, it may be possible to extract the peak frequencies for the frequency characteristics in multiple patterns (specimens) differing in pattern sizes, for example. Then, it is possible to increase the frequencies used to interpolate or approximate correction factors.

Figure 23:
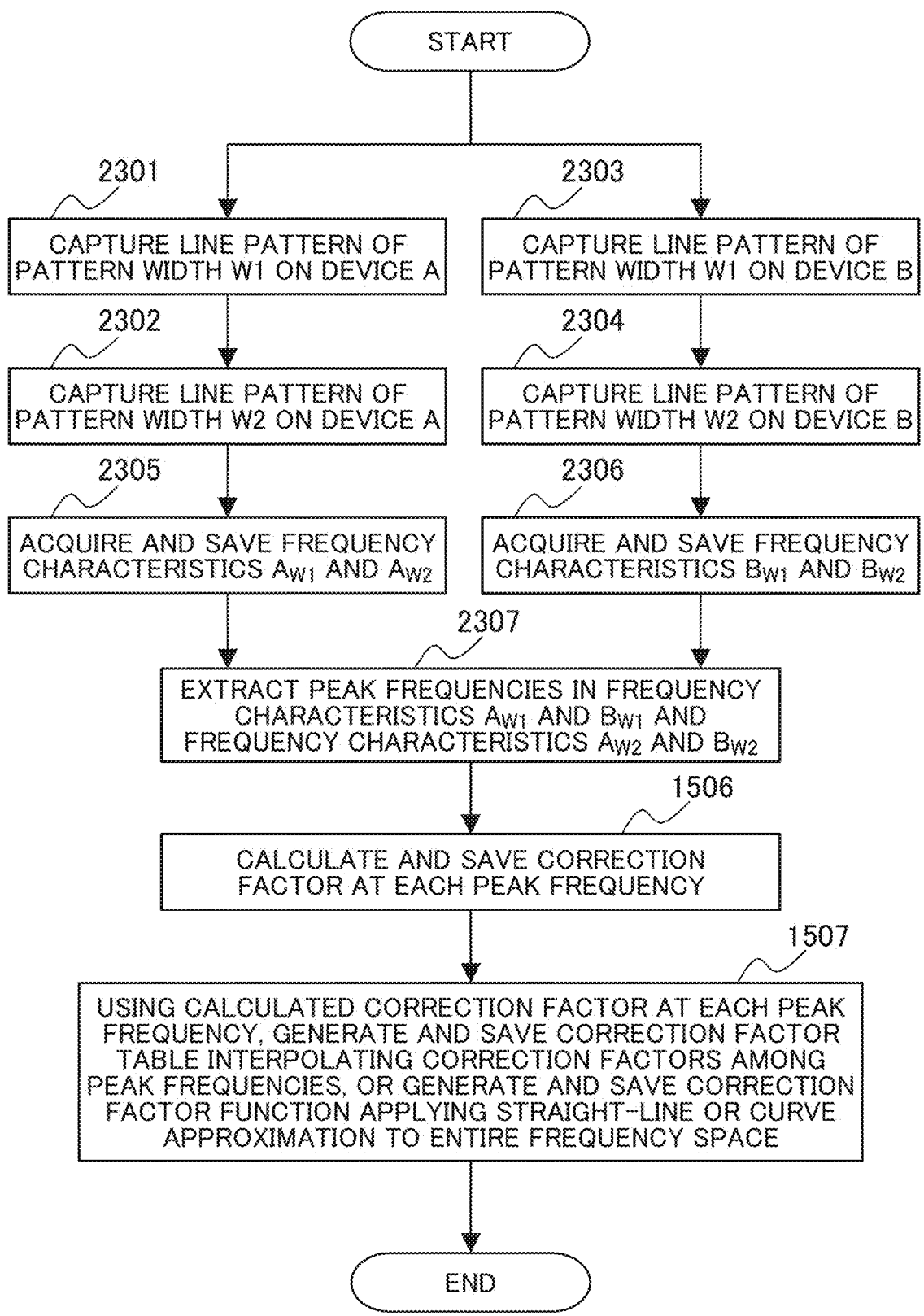
FIG. 23 is a flowchart illustrating the thirteenth embodiment of the present invention and a process to calculate a correction factor.

FIG. 23 illustrates a flowchart according to the present embodiment.

Device A as the reference device captures multiple (one or more) SEM images of the specimen (reference specimen) based on the line pattern using pattern width W1 (2301). Device A captures multiple (one or more) SEM images of the specimen (reference specimen) based on the line pattern using pattern width W2 (2302). Similarly, device B captures multiple (one or more) SEM images of the specimen (reference specimen) based on the line pattern using pattern width W1 and the specimen (reference specimen) based on the line pattern using pattern width W2 (2303, 2304). In this case, device A and device B preferably capture the same specimen based on the line pattern using pattern width W1. Similarly, device A and device B preferably capture the same specimen based on the line pattern using pattern width W2. The line pattern using pattern width W1 and the line pattern using pattern width W2 may be formed at different positions on the same specimen (reference specimen).

Device A performs Fourier transform, for example, on the captured line pattern images using widths W1 and W2 to calculate and save frequency characteristics $A_{W1}$ and $A_{W2}$ (2305). Similarly, device B performs Fourier transform, for example, on the captured line pattern images using widths W1 and W2 to calculate and save frequency characteristics $B_{W1}$ and $B_{W2}$ (2306). The process then extracts peak frequencies in frequency characteristics $A_{W1}$ and $B_{W1}$ (2307). Similarly, the process extracts peak frequencies in frequency characteristics $A_{W2}$ and $B_{W2}$ (2307). The peak frequency can be selectively extracted from the maximum value of frequency components in a specific band or the frequency whose frequency component is greater than or equal to a predetermined threshold.

At the next step, the process calculates a correction factor at each peak frequency (1506). For example, suppose device A is used as the reference device and device B is adjusted to device A. Then, (Equation 1) is used to calculate a correction factor at each peak frequency.

Then, the calculated correction factor at each peak frequency is used to create a correction factor table interpolating correction factors among peak frequencies or a correction factor function applying straight-line or curve approximation to the entire frequency space (1507).

The peak frequency is extracted from the frequency characteristic of the secondary electron image acquired by scanning the line pattern using width W1. Then, the correction factor at the peak frequency is calculated. Similarly, the correction factor is calculated for the line pattern using width W2. The method described in the eleventh embodiment is applied to create a correction factor table or a correction factor function through the use of the correction factors at the peak frequencies calculated from the line pattern images using widths W1 and W2. FIG. 17 (B) illustrates a correction factor function resulting from the curve approximation. The use of a specimen based on two line patterns differing in pattern widths can increase the number of peak frequencies needed to create a correction factor table or a correction factor function. It is possible to create a correction factor table or a correction factor function that can highly efficiently reduce image differences.

The above-described process can be performed on three or more specimens as well. Many patterns (specimens) differing in frequency characteristics (peak frequencies) are used to create more versatile correction factor tables and correction factor functions. Consequently, image differences can be corrected even in captured images based on various patterns differing in frequency characteristics. Consider the creation of correction factor tables and correction factor functions that are more versatile and highly efficiently reduce image differences. For this purpose, it may be possible to use black silicon as a specimen (reference specimen) that can extract peak frequencies in a relatively wide frequency band. Then, it is possible to reduce the number of specimens (reference specimens). The present embodiment extracts the peak frequency by finding the frequency characteristic from the secondary electron image of the pattern. However, it may be also favorable to extract the peak frequency by finding the frequency characteristic from the signal profile of secondary electrons. For example, it is preferable for hole patterns to find frequency characteristics from images. It may be convenient for line patterns to find frequency characteristics from a signal profile and extract the peak frequencies. This can also produce a comparable effect on the image correction.

Fourteenth Embodiment

Figure 18:
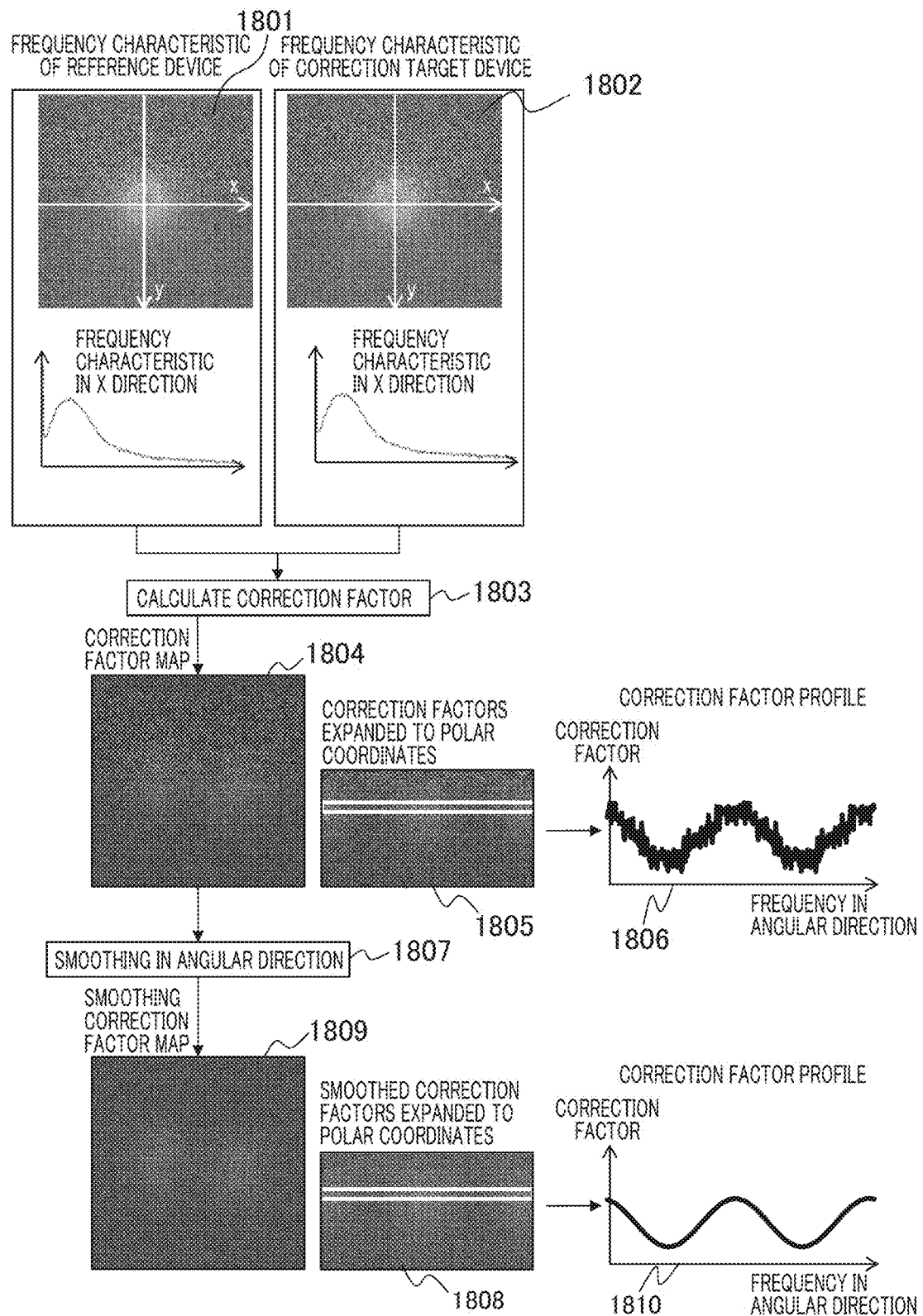
FIG. 18 is a flowchart illustrating a fourteenth embodiment of the present invention and a process to smooth a correction factor.

The present embodiment will describe a method for smoothing the correction factor. No distinctive frequency peak may appear in the frequency characteristic for images of the specimen having a random pattern structure (in terms of pattern shapes or pattern array pitches). The image difference may not be appropriately corrected through the use of the correction factor at the peak frequency calculated by the method described in the previous embodiments. Suppose the correction factor table or the correction factor function is calculated from the frequency characteristics for images acquired by the reference device and a correction target device. Then, the correction factor table and the correction factor function are susceptible to noise. Correction on an intended image may cause only a specific frequency to be excessively or insufficiently corrected. The description below explains a flow of the process to smooth the correction factor table and the correction factor function to solve these problems or reduce the effects of excessive or insufficient correction. FIG. 18 illustrates a flow of the following process using arrows. Frequency characteristics are provided on the condition that the reference device and the correction target device capture the specimen having a random pattern structure (in terms of pattern shapes or pattern array pitches). The frequency characteristic is used to calculate a correction factor map. The correction factor map is expanded in the angular direction to provide a correction factor and its profile. The correction factor is smoothed in the angular direction to provide a smoothing correction factor map. The smoothing correction factor map is expanded in the angular direction to provide a correction factor and its profile. The reference device captures the specimen having the random pattern structure to generate an image given an image frequency characteristic 1801. The correction target device captures the same specimen to generate an image given an image frequency characteristic 1802. The process uses the image frequency characteristic 1801 and the frequency characteristic 1802 to calculate a correction factor (1803) and generate a correction factor map (1804). A change in beam shapes due to a machine difference between the reference device and the correction target device appears as a two-dimensional distribution on the correction factor map 1504. The process expands the correction factors to polar coordinates based on the center (direct-current component of the frequency space) of the two-dimensional distribution of the correction factor map 1804 (1805). A smoothing process is performed in the angular direction using a spatial filter (1807) to generate a smoothing correction factor 1508 expanded into the polar coordinates. After the smoothing process, the resulting correction factor profile shows less noise than the correction factor profile 1806 before the smoothing process (1810). The process then converts a smoothing correction factor map 1808 into two-dimensional coordinates (x-y coordinates) to provide a smoothing correction factor map 1809. The smoothing process is performed in the angular direction after the correction factor map 1804 is expanded into polar coordinates. The correction factor is not excessively blurred even if the filter size of the spatial filter is relatively large. Therefore, the correction effect can be ensured to a certain degree. Without limitation to the above-described method, the smoothing is also available by eliminating noise based on the moving average or using a low-pass filter resulting from calculating frequency characteristics in the angular direction. As above, the use of the smoothed correction table for the correction can suppress the influence of noise and solve the issue such as excessive or insufficient correction of a specific frequency.

Fifteenth Embodiment

FIG. 19 is a diagram illustrating the schematic configuration of an electron beam observation system according to the fifteenth embodiment. A computer system (management system) 1901 is connected to as many as K (K≥2) electron beam observation devices according to the configuration illustrated in FIG. 1 via the communication means 1002. The computer system 1901 performs processes related to images and correction factors, for example, and uses a correction factor processing portion 1902, the input/output interface portion 1005, and the overall control portion 1006 as needed. The correction factor processing portion 1902 saves images, correction factors, for example, and related information. The input/output interface portion 1005 transfers images and secondary signal profile data via the input/output portion 1004 or the communication means 1002. The overall control portion 1006 can also control the electron beam observation devices.

The correction factor processing portion 1902 includes a calculation portion 1903 to perform operations related to correction factors, for example, and a storage portion 1904 to save information. The storage portion 1904 uses an image storage portion 1909, a signal waveform storage portion 1910, the accompanying information storage portion 1012, the frequency characteristic storage portion 1011, and a correction factor storage portion 1911 as needed. The image storage portion 1909 stores images acquired by the electron beam observation devices. The signal waveform storage portion 1910 stores secondary signal profiles acquired by the electron beam observation devices. The accompanying information storage portion 1012 stores accompanying information such as an image capture condition for each image or secondary signal profile. The accompanying information is acquired from each electron beam observation device along with images and secondary signal profiles. The frequency characteristic storage portion 1011 stores frequency characteristics processed in the calculation portion 1903. The correction factor storage portion 1911 stores correction factors processed in the calculation portion 1903. The calculation portion 1903 uses an image calculation portion 1905, a signal waveform calculation portion 1906, the frequency characteristic calculation portion 1009, the frequency characteristic analysis portion 1013, a correction factor calculation portion 1907, and a reference correction factor specification portion 1908 as needed. The image calculation portion 1905 calculates frequency characteristics from images acquired by the electron beam observation devices. The signal waveform calculation portion 1906 calculates frequency characteristics from secondary signal profiles acquired by the electron beam observation devices. The frequency characteristic calculation portion 1009 performs operations on frequency characteristics calculated in the image calculation portion 1905 or the signal waveform calculation portion 1906 or frequency characteristics stored in the frequency characteristic storage portion 1011. The frequency characteristic analysis portion 1013 analyzes these frequency characteristics. The correction factor calculation portion 1907 calculates a correction factor from multiple frequency characteristics. The reference correction factor specification portion 1908 specifies a correction factor as the reference to adjust a machine difference.

As intrinsic functions, the computer system 1901 receives input such as images or secondary signal profiles acquired from multiple electron beam observation devices. The computer system 1901 also outputs not only images, secondary signal profiles, and frequency characteristics, but also data such as correction factor calculation results and a correction factor as the reference to the input/output portion 1004.

The computer system 1901 uses images or secondary signal profiles acquired by devices 1-1 to 1-K to selectively extract peak frequencies from the frequency characteristics and calculate a correction factor at the peak frequency. The computer system 1901 can allow the storage portion 1903 to store a correction factor as the reference to adjust the image difference, use the correction factor to correct images captured by devices 1-1 to 1-K, and display images before and after the correction via the input/output portion 1004. The computer system 1901 transmits the reference correction factor or the corrected image to each of devices 1-1 to 1-K in response to a request from the device. Each device may correct other images using the reference correction factor or may display the corrected and transmitted image.

Figure 24:
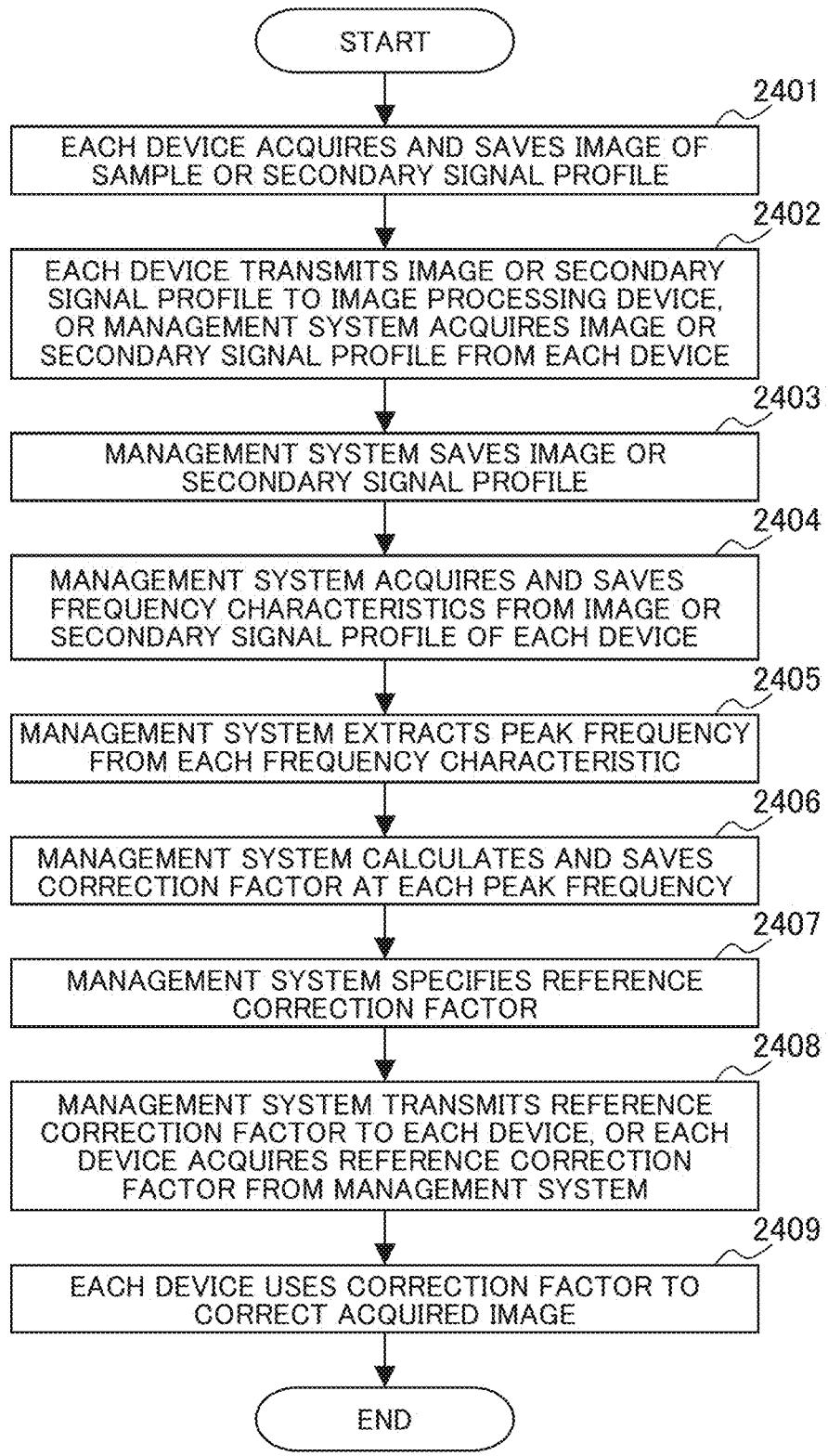
FIG. 24 is a flowchart illustrating the fifteenth embodiment of the present invention and an image correcting method.

FIG. 24 illustrates a flowchart according to the present embodiment. Each of devices 1-1 to 1-K acquires an SEM image or a secondary signal profile of the specifically patterned specimen (reference specimen) and saves it in the storage portion 111 (2401). Devices 1-1 to 1-K transmit the respective images or secondary signal profiles to the computer system 1901 (2402). The computer system 1901 may acquire a targeted frequency characteristic saved in the storage portion 111 of each device (2402). The computer system 1901 saves the images and the secondary signal profiles together with the accompanying information in the frequency characteristic storage portion 1011 and the accompanying information storage portion 1012 (2403). The image calculation portion 1905 or the signal waveform calculation portion 1906 of the computer system 1901 of the calculation portion 1903 acquires frequency characteristics from the corresponding images or secondary signal profiles and saves the frequency characteristics in the image storage portion 1909 or the signal waveform storage portion 1910 of the storage portion 1904 (2404). The frequency characteristic analysis portion 1013 of the calculation portion 1903 of computer system 1901 extracts peak frequencies from the frequency characteristics (2405). The correction factor calculation portion 1907 of the computer system 1901 calculates a correction factor at each peak frequency and saves it in the correction factor storage portion 1911 of the storage portion 1904 (2406). The correction factor calculation portion 1907 may create a correction factor table or a correction factor function based on the correction factor and save the correction factor table or the correction factor function in the correction factor storage portion 1911. The reference correction factor specification portion 1908 of the calculation portion 1903 of the computer system 1901 specifies a reference correction factor from the correction factors saved in the correction factor storage portion 1907 (2407). The reference correction factor specification portion 1908 may specify a correction factor table or a correction factor function as the reference. The computer system 1901 transmits the specified reference correction factor to devices 1-1 to 1-K (2408). Instead, the devices may acquire the reference correction factor from the computer system 1901 (2408). The devices correct images acquired by using the correction factor, the correction factor table, or the correction factor function as the reference and (Equation 3) (2409).

The fifteenth embodiment can reduce the machine difference among the multiple devices 1 and accurately manage operations of the electron beam observation system including the multiple devices 1. The electron beam observation devices acquire images and secondary signal profiles. The computer system 1901 saves the images and the secondary signal profiles along with the accompanying information in the storage portion 1904. This makes it possible to provide centralized management of data measured in the devices and facilitate data management in the electron beam observation system.

Sixteenth Embodiment

The first through fifteenth embodiments have described the examples on a so-called single beam device, namely, the electron beam observation device using one electron beam. The eleventh embodiment will describe examples of applying the present invention to a so-called multi-beam device or multi-column device, namely, the electron beam observation device using two or more electron beams as illustrated in FIG. 11.

The multi-beam device or the multi-column device may cause variations in the resolution of an image acquired by each of the multiple electron beams passing through the device or results of measuring a specimen pattern using the image. This is because the beam current or the aberration due to the lens differs from one electron beam to another. As described in the first through fifteenth embodiments, it is favorable to keep a small difference (machine difference) in resolutions or length measurement values among multiple devices. The same applies to a difference (electron beam difference) in resolutions or length measurement values among electron beams in the multi-beam device or the multi-column device. The technique of the present invention, described in the first through fifteenth embodiments and applied to images acquired by multiple devices, can be also applied to images acquired by multiple electron beams in one multi-beam device or multi-column device and thereby reduce the electron beam difference in the multi-beam device or the multi-column device.

The present embodiment will describe the contents of the first embodiment as a representative example by replacing multiple devices with multiple electron beams. Similarly, replacement of multiple devices with multiple electron beams in the second through fifteenth embodiments provides contents of reducing an electron beam difference in the multi-beam device or the multi-column device but a description is omitted for simplicity.

The present embodiment will describe an example where the electron beam observation device is assumed to be a multi-beam device. The same applies to a multi-column device that includes multiple columns in the same device.

FIG. 11 is a diagram illustrating a schematic configuration of the electron beam observation device according to the eleventh embodiment. The hardware configuration will be described first. An electron beam (electron ray) 1102 is irradiated from an electron source (electron gun) 1101 in the downstream direction (downward in the drawing). A lens 1103, a multi-beam forming portion 1104, a detector array 1106, a beam separator 1107, and a scanning deflector 1108 are placed in the downstream direction. Though not shown, the electron optical system also includes an aligner for adjusting the central axis (optical axis) of the primary beam and an aberration corrector, for example. The lens 1103 is available as an electromagnetic lens using an exciting current to control the focus, an electrostatic lens, or a combination of these. The present embodiment assumes the multi-beam forming portion 1104 to be a combination of an aperture array and a lens array. However, the scope of the present invention is not limited thereto. The present embodiment assumes the electron source to be an electron source 1101 alone. The present invention takes effect even when multiple electron sources are used to correspond to electron beams for the multi-beam. The detector array 1106 contains multiple detectors 1106a to 1106e inside.

The computer system 116 is composed of the system control portion 110, the control device 109, and the input/output portion 113.

A wafer, namely, a specimen 1110 is placed on a stage 1109 capable of moving. The electron source 1101, the lens 1103, the multi-beam forming portion 1104, the detector array 1106, the beam separator 1107, the scanning deflector 1108, and the stage 1109 are connected to the control device 109. The control device 109 further connects with the system control portion 110.

Functionally, the system control portion 110 includes the storage device 111 and the calculation portion 112 and connects with the input/output portion 113 including an image display device. Though not illustrated, components other than the control system and the circuit system are placed in a vacuum container and operate under the vacuum exhaust condition. In addition, a wafer transport system is provided to place a wafer on the stage 1109 from outside the vacuum.

More specifically, the system control portion 110 is configured to include a central processing portion available as the calculation portion 112 and a storage portion available as the storage device 111. The central processing portion as the above-described calculation portion 112 executes a control program 120 or an image processing portion 148 stored in the storage device 111. As a result, it is possible to process images related to defect inspection or dimension measurement or control the control device 109, for example. The image processing portion 148 is a program that processes SEM images.

The present embodiment may use a generic term of control portion to signify the system control portion 110 including the input/output portion 113 and the control device 109, for example. The input/output portion 113 may be separately configured as an input portion and an output portion correspondingly represented by the input means such as a keyboard and a mouse and the display means such as a liquid crystal display device. Alternatively, the input/output portion 113 may be configured as an integrated input/output means using a touch panel, for example.

The description below explains the image observation performed through the use of the device according to the present embodiment. The lens 1103 forms an electron beam 1102 emitted from the electron source 1101 into an approximately parallel beam that then enters the multi-beam forming portion 1104 to be formed into multi-beams 1105a through 1105e. The present embodiment provides the example of five multi-beams (1105a through 1105e). However, the present invention takes effect even when the number of beams is larger or smaller than or equal to five. The electron beams 1105a through 1105e formed into multi-beams pass through the beam separator 1107 and, while being deflected by the scanning deflector 1108, are focused on the specimen 1110 so that the beam diameter is minimized.

The control device 109 controls the scanning deflector 1108 so that each of the electron beams 1105a through 1105e formed into multi-beams scans a predetermined area of the specimen 1110. The electron beams 1105*a* through 1105*e* formed into multi-beams reach the surface of the specimen 1110 and interact with a substance near the surface. The specimen then generates incidental electrons such as backscattered electrons, secondary electrons, and Auger electrons, causing signals to be acquired. The present embodiment describes a signal as a secondary electron. Secondary electrons 1111*a* through 1111*e* are generated from the position where the electron beams 1105*a* through 1105*e* formed into multi-beams reached the specimen 1110. The secondary electrons 1111*a* through 1111*e* are orbitally separated from the electron beams 1105*a* through 1105*e* formed into multi-beams by the beam separator 1107. Each of the detectors 1106*a* through 1106*e* in the detector array 1106 detects the secondary electrons 1111*a* through 1111*e*. A signal process on the secondary electrons 1111*a* through 1111*e* detected from the detectors 1106*a* to 1106*e* is performed in synchronization with a scanning signal transmitted from the control device 109 to the scanning deflector 1108. Consequently, an image (SEM image) is generated and the specimen 1110 is observed.

The generated image can be stored in the storage device 111 or a non-volatile storage device (unshown). The image processing portion 148, to be described later, processes images stored in the storage portion such as the storage device 111 or the non-volatile storage device.

It may be favorable to change the order of placing the lens 1103, the multi-beam forming portion 1104, the detector array 1106, the beam separator 1107, and the scanning deflector 1108 according to the present embodiment. Electronic optical elements other than those illustrated in FIG. 11 may be included. In terms of the configuration, though unshown, there is placed an aligner to adjust positions and angles of the electron beam 1102 or the electron beam 1105*a* through 1105*e* formed into multi-beams between the electron source 1101 and the specimen 1110. It is possible to correct the central axis of the electron beam 1102 or the electron beam 1105*a* through 1105*e* formed into multi-beams when the central axis deviates from various electronic optical elements.

Pattern dimensions of specimen 1110 may be measured from images acquired through the use of the electron beam 1105*a* through 1105*e* formed into multi-beams. In this case, it is favorable to keep a small difference (electron beam difference) in resolutions, the amount of probe current, or length measurement values among multiple electron beams. Conventionally, attempts were made to decrease electron beam differences to a permissible range by adjusting the constituent components illustrated in FIG. 11 in terms of hardware and software. However, aging after the use of the devices or an influence of the usage environment may cause a slight shape difference, for example, in the electron beam and consequently an electron beam difference over the permissible range.

According to the present embodiment, image processing in the image processing portion 148 in FIG. 11 reduces an electron beam difference among the electron beams 1105*a* through 1105 formed into multi-beams. The process assumes a certain electron beam to be the reference electron beam and corrects an image acquired by the electron beam that requires reducing an electron beam difference.

Using the flowchart in FIG. 2 or FIG. 5, the first embodiment has provided the example of calculating the correction factor to adjust device B to device A based on device A as the reference device. The present embodiment can reduce the electron beam difference on the assumption that "image acquired by any of the electron beams 1105*a* through 1105*e*" replaces "image acquired by device A or B" in that flowchart. All the other contents are the same as those explained in the first embodiment and a description is omitted for simplicity.

Suppose the electron beam 1105*a* is used as the reference electron beam to reduce an electron beam difference in the image acquired by the electron beam 1105*b* based on the reference electron beam. In this case, the image acquired by the electron beam 1105*a* is assumed to be an image acquired by device A. The image acquired by the electron beam 1105*b* is assumed to be an image acquired by device B. Then, it is possible to calculate a correction factor to reduce the electron beam difference (306). Similarly, correction factors can be calculated for the electron beams 1105*c* to 1105*e*. Consequently, it is possible to reduce electron beam differences for all the electron beams 1105*a* through 1105*e* formed into multi-beams in the corresponding electron beam observation device.

According to the present embodiment like the first embodiment, the scope of the invention includes the reduction of a difference between images acquired from the same electron beam (such as 1105*a*). This can apply to a chronological change in the electron beam 1105*a*, for example.

The invention takes effect even when all images are corrected by defining a reference electron beam using an image captured by an electronic device other than the pertinent electron beam observation device and finding a correction factor corresponding to the reference electron beam for all the electron beams 1105*a* through 1105*e* formed into multi-beams.

As above, according to the present embodiment, the image processing portion 148 correct images based on a correction factor calculated from images captured by the electron beams 1105*a* through 1105*e* formed into multi-beams.

Similar to the first embodiment, an image correction processing method can follow the explanatory diagram illustrated in FIG. 3, for example.

Concerning FIGS. 12 and 13, the description below explains a procedure to acquire the correction factor to reduce an electron beam difference in the multi-beams. FIG. 12 is a flowchart that acquires a correction factor to reduce electron beam differences. An operator starts acquiring the correction factor to reduce electron beam differences by using the input/output device 113 equipped with the image display device (step S1201 in FIG. 12). The image display device displays a multi-beam electron beam difference reduction screen illustrated in FIG. 13. Hereinafter, FIG. 13 is referenced unless otherwise specified. The operator selects an optical condition to reduce the electron beam difference from the pull-down menu of a condition selection portion 1301. The image display device reflects conditions such as acceleration voltage, opening angle, beam current, and inter-beam distance previously saved in the storage device 111. These optical conditions are just examples. The optical conditions are not always included. The other optical conditions may be provided. The operator presses a condition activation button 1302 to determine the optical condition (step S1202). The present embodiment provides the example of selecting optical conditions from the pull-down menu. However, optical conditions may be directly entered. The optical condition provides a collection of the focusing condition of the lens and results of adjusting the beam current, opening angle, acceleration voltage, and optical axis of the electron beam, for example. The storage device 111 saves the results that are adjusted or configured in advance. When the condition is selected, the system control portion 110 allows the control device 109 to transmit a control signal to the device. Then, the specified optical condition is set.

When the condition setting is complete, the operator prepares to reduce electron beam differences by using a reference electron beam selection portion 1303 to select a reference electron beam and pressing a reference electron beam setup button (step S1203 in FIG. 12). The present embodiment selects the electron beam 1105a as the reference electron beam. As already described, the reference electron beam may be selected from any electron beams in the pertinent electron beam observation device, electron beams in the electron beam observation devices other than the pertinent one, or electron beams used to acquire images that were captured in the past. An SEM image display portion 1304 displays continually updated SEM images. A new image is captured and updated each time an update button 1305 is pressed. The present embodiment has described the example of displaying three types of SEM images: the SEM image captured through the use of the reference electron beam; the SEM image captured through the use of the electron beam selected by the operator while manipulating the displayed electron beam selection portion 1306; and the SEM image with an electron beam difference reduced by the technique of the present invention. The SEM image with the reduced electron beam difference will be described later. Even an electron beam not selected in the displayed electron beam selection portion 1306 acquires SEM images. Depending on screen configurations, there may be an example of displaying SEM images captured by all the electron beams.

The operator then presses a correction factor calculation button 1307 to calculate the correction factor (step S1204). At this step, as already described, the calculation portion 112 and the image processing portion 148 perform various arithmetic processes saved in the storage device 111 according to the flowchart in FIG. 2 or FIG. 5 to calculate correction factors related to the electron beams as multi-beams. The correction factors are temporarily saved in the storage device 111. The present embodiment provides the example where all electron beams simultaneously acquire SEM images and the correction factors are also calculated in parallel. Correction factors for the beams may be acquired separately depending on specifications of the calculation portion 112 or the reference specimen 108. This flowchart does not describe the specimen. For example, a dedicated specimen may be always provided in the device. The stage may automatically move to the corresponding specimen position when the multi-beam electron beam difference reduction screen in FIG. 13 is called.

After the calculation of the correction factor is completed, an electron beam difference display portion 1308 displays an electron beam difference after reducing the electron beam difference after the image processing is performed by the method according to FIG. 3 based on the above-described correction factor. The above-described example in the present embodiment uses the resolution and length measurement values as indexes to represent the electron beam difference and displays a ratio of each value to the value of the SEM image corresponding to the reference electron beam. Any index is available as long as it represents an electron beam difference. The present invention takes effect even if the index is not the resolution or length measurement value. The example displays a ratio to the reference. However, the present invention takes effect even when absolute values are compared or any other modes are used. According to the present embodiment, the SEM image display portion 1304 is updated at this point. The displayed SEM image includes the reduced electron beam difference and is subject to image processing performed by the method according to FIG. 3 based on the above-described correction factor. Though not explicitly described in the present embodiment, the storage device 111 saves the previously acquired correction factor as a table of correction factors to reduce electron beam differences. The step to select the reference electron beam may call the correction factor and update the value of the electron beam difference display portion 1308.

The operator confirms the reduction of the electron beam difference according to the above-described process flow and then presses a completion button 1309. The table of correction factors for electron beam difference reduction is updated to complete the multi-beam electron beam difference reduction (S1205).

As above, it is favorable to create the table of correction factors to reduce multi-beam electron beam differences in advance. Then, the method in FIG. 3 can be used to perform the image process for the specimen observation or the measurement or inspection based on the observation. It is possible to acquire images with reduced electron beam difference in real-time or as post-processing.

Consequently, it is possible to reduce electron beam differences in a multi-beam or multi-column device.

Overview

The present invention is widely effective in reducing machine differences among devices and correcting images in the frequency space based on the captured image independently of the beam shape conversion.

The present invention is not limited to the above-described embodiments and includes various modifications. For example, the above-mentioned embodiments are described in detail to explain the present invention in an easy-to-understand manner. The present invention is not necessarily limited to the whole of all the configurations described. It is possible to replace part of the configuration of one embodiment with the configuration of another embodiment. It is also possible to add the configuration of one embodiment to the configuration of another embodiment. Part of the configuration of each embodiment can be subject to one of or a combination of addition, deletion, and replacement of other configurations.

Part or all of the above-described configurations, functions, processing portions, and processing means, for example, may be embodied as hardware by designing integrated circuits, for example. The above-described configurations and functions, for example, may be embodied as software by allowing the processor to interpret and execute programs that provide the functions. Information such as programs, tables, and files to embody the functions can be stored in recording devices such as memory, hard disks, and SSD (Solid State Drive), or recording media such as IC cards, SD cards, and DVDs.

There have been described the control lines and information lines that are considered necessary for the explanation. Not all control lines and information lines as a product are illustrated. In practice, almost all configurations may be considered to be interconnected.

LIST OF REFERENCE SIGNS

101 . . . electron source
102 . . . electron beam
103 . . . modified illumination aperture
104 . . . detector
105 . . . scanning deflector
106 . . . objective lens 107 . . . stage
108 . . . specimen
109 . . . control device
110 . . . system control portion
111 . . . storage device
112 . . . calculation portion
113 . . . input/output portion
114 . . . secondary electron
115 . . . optical axis
116 . . . computer system
120 . . . control program
121 . . . communication means
148 . . . image processing portion
154 . . . aperture plate

The invention claimed is:

1. A correction factor calculation method in an electron beam observation device for correcting images among a plurality of the electron beam observation devices each of which generates an image by irradiating an electron beam over a specimen, the method comprising the steps of:
allowing a first electron beam observation device to generate a first image data by irradiating a first electron beam over a first pattern and a second pattern differing from the first pattern in a shape or a size, in which the first pattern and the second pattern are included in a specimen, or the first pattern is included in a first specimen and the second pattern is included in a second specimen;
allowing a second electron beam observation device to generate a second image data by irradiating a second electron beam over the first and second patterns; and
allowing one of the first and second electron beam observation devices to calculate a correction factor at a frequency selectively extracted from first and second frequency characteristics calculated based on the first and second image data.

2. The correction factor calculation method for correcting images in an electron beam observation device according to claim 1,
wherein the first and second frequency characteristics include amplitudes applicable to converting the first and second image data into frequency space images.

3. The correction factor calculation method for correcting images in an electron beam observation device according to claim 2,
wherein the first and second frequency characteristics are calculated by one of multiplication and division that applies a factor to each of factors generated when the first and second image data are converted into frequency space images.

4. The correction factor calculation method for correcting images in an electron beam observation device according to claim 1, the method comprising the step of:
allowing one of the first and second electron beam observation devices to create one of a correction factor table and a correction factor function based on the calculated correction factor.

5. A method in an electron beam observation device for correcting images among a plurality of the electron beam observation devices each of which generates an image by irradiating an electron beam over a specimen, the method comprising the steps of:
allowing a first electron beam observation device to generate a first image data by irradiating a first electron beam over a first pattern and a second pattern differing from the first pattern in a shape or a size, in which the first pattern and the second pattern are included in a specimen, or the first pattern is included in a first specimen and the second pattern is included in a second specimen;
allowing a second electron beam observation device to generate a second image data by irradiating a second electron beam over the first and second patterns;
allowing one of the first and second electron beam observation devices to calculate a correction factor at a frequency selectively extracted from first and second frequency characteristics calculated based on the first and second image data; and
allowing one of the first and second electron beam observation devices to use the correction factor and correct a third image data acquired by one of the first and second electron beam observation devices.

6. An electron beam observation system including a plurality of electron beam observation devices that generate images by irradiating an electron beam over a specimen,
wherein a first electron beam observation device includes a first computer system that generate a first image data by irradiating a first electron beam over a first pattern and a second pattern differing from the first pattern in a shape or a size, in which the first pattern and the second pattern are included in a specimen, or the first pattern is included in a first specimen and the second pattern is included in a second specimen;
wherein a second electron beam observation device includes a second computer system that generates a second image data by irradiating a second electron beam over the first and second patterns;
wherein one of the first and second computer systems calculates a correction factor at a frequency selectively extracted from first and second frequency characteristics calculated based on the first and second image data; and
wherein one of the first and second computer systems uses the correction factor and corrects a third image data acquired by one of the first and second electron beam observation devices.

7. A correction factor calculation method in an electron beam observation device for correcting images among a plurality of the electron beam observation devices each of which generates an image by irradiating an electron beam over a specimen, the method comprising the steps of:
allowing a first electron beam observation device to generate a first image data by irradiating a first electron beam over a first pattern and a second pattern differing from the first pattern in a shape or a size, in which the first pattern and the second pattern are included in a specimen, or the first pattern is included in a first specimen and the second pattern is included in a second specimen;
allowing the first electron beam observation device to calculate a first frequency characteristic based on the first image data;
allowing a second electron beam observation device to generate a second image data by irradiating a second electron beam over the first and second patterns;
allowing the second electron beam observation device to calculate a second frequency characteristic based on the second image data; and
allowing one of the first and second electron beam observation devices to calculate a correction factor at a frequency selectively extracted from the first and second frequency characteristics.

8. A method in an electron beam observation device for correcting images among a plurality of the electron beam observation devices each of which generates an image by irradiating an electron beam over a specimen, the method comprising the steps of:

allowing a first electron beam observation device to generate a first image data by irradiating a first electron beam over a first pattern and a second pattern differing from the first pattern in a shape or a size, in which the first pattern and the second pattern are included in a specimen, or the first pattern is included in a first specimen and the second pattern is included in a second specimen;

allowing the first electron beam observation device to calculate a first frequency characteristic based on the first image data;

allowing a second electron beam observation device to generate a second image data by irradiating a second electron beam over the first and second patterns;

allowing the second electron beam observation device to calculate a second frequency characteristic based on the second image data;

allowing one of the first and second electron beam observation devices to calculate a correction factor at a frequency selectively extracted from the first and second frequency characteristics; and allowing one of the first and second electron beam observation devices to use the correction factor and correct a third image data acquired by one of the first and second electron beam observation devices.

9. An electron beam observation system including a plurality of electron beam observation devices that generate images by irradiating an electron beam over a specimen, wherein a first electron beam observation device includes a first computer system that generate a first image data by irradiating a first electron beam over a first pattern and a second pattern differing from the first pattern in a shape or a size, and calculates a first frequency characteristic based on the first image data, in which the first pattern and the second pattern are included in a specimen, or the first pattern is included in a first specimen and the second pattern is included in a second specimen;

wherein a second electron beam observation device includes a second computer system that generates a second image data by irradiating a second electron beam over the first and second patterns and calculates a second frequency characteristic based on the second image data;

wherein one of the first and second computer systems calculates a correction factor at a frequency selectively extracted from the first and second frequency characteristics; and wherein one of the first and second computer systems uses the correction factor and corrects a third image data acquired by one of the first and second electron beam observation devices.

10. A correction factor calculation method for correcting images among a plurality of electron beam observation devices in an electron beam observation system including the electron beam observation device to generate an image by irradiating an electron beam over a specimen and a computer system configured to be communicable with a plurality of the electron beam observation devices, the method comprising the steps of:

allowing a first electron beam observation device to generate a first image data by irradiating a first electron beam over a first pattern and a second pattern differing from the first pattern in a shape or a size, in which the first pattern and the second pattern are included in a specimen, or the first pattern is included in a first specimen and the second pattern is included in a second specimen;

allowing a second electron beam observation device to generate a second image data by irradiating a second electron beam over the first and second patterns; and allowing the computer system to calculate a correction factor at a frequency selectively extracted from first and second frequency characteristics calculated based on the first and second image data.

11. A method for correcting images among a plurality of electron beam observation devices in an electron beam observation system including the electron beam observation device to generate an image by irradiating an electron beam over a specimen and a computer system configured to be communicable with a plurality of the electron beam observation devices, the method comprising the steps of:

allowing a first electron beam observation device to generate a first image data by irradiating a first electron beam over a first pattern and a second pattern differing from the first pattern in a shape or a size, in which the first pattern and the second pattern are included in a specimen, or the first pattern is included in a first specimen and the second pattern is included in a second specimen;

allowing a second electron beam observation device to generate a second image data by irradiating a second electron beam over the first and second patterns;

allowing the computer system to calculate a correction factor at a frequency selectively extracted from first and second frequency characteristics calculated based on the first and second image data; and allowing one of the first and second electron beam observation devices to use the correction factor and correct a third image data acquired by one of the first and second electron beam observation devices.

12. An electron beam observation system comprising:

an electron beam observation device to generate an image by irradiating an electron beam over a specimen; and a third computer system configured to be communicable with a plurality of the electron beam observation devices, wherein a first electron beam observation device includes a first computer system that generates a first image data by irradiating a first electron beam over a first pattern and a second pattern differing from the first pattern in a shape or a size, in which the first pattern and the second pattern are included in a specimen, or the first pattern is included in a first specimen and the second pattern is included in a second specimen;

wherein a second electron beam observation device includes a second computer system that generates a second image data by irradiating a second electron beam over the first and second patterns;

wherein the third computer system calculates a correction factor at a frequency selectively extracted from first and second frequency characteristics calculated based on the first and second image data; and wherein one of the first and second computer systems uses the correction factor and corrects a third image data acquired by one of the first and second electron beam observation devices.

13. A correction factor calculation method for correcting images among a plurality of electron beam observation devices in an electron beam observation system including the electron beam observation device to generate an image by irradiating an electron beam over a specimen and a computer system configured to be communicable with a plurality of the electron beam observation devices, the method comprising the steps of:

allowing a first electron beam observation device to generate a first image data by irradiating a first electron beam over a first pattern and a second pattern differing from the first pattern in a shape or a size, in which the first pattern and the second pattern are included in a specimen, or the first pattern is included in a first specimen and the second pattern is included in a second specimen;

allowing the first electron beam observation device to calculate a first frequency characteristic based on the first image data;

allowing a second electron beam observation device to generate a second image data by irradiating a second electron beam over the first and second patterns;

allowing the second electron beam observation device to calculate a second frequency characteristic based on the second image data;

allowing the computer system to specify a reference frequency characteristic based on the first and second frequency characteristics; and allowing one of the first and second electron beam observation devices to calculate a correction factor at a frequency selectively extracted from the reference frequency characteristic and one of the first and second frequency characteristics.

14. The correction factor calculation method for correcting images in an electron beam observation device according to claim 13,
wherein the reference frequency characteristic is comparable to one of the first frequency characteristic and the second frequency characteristic.

15. The correction factor calculation method for correcting images in an electron beam observation system according to claim 13,
wherein the reference frequency characteristic is an average value of a plurality of frequency characteristics and the plurality of frequency characteristics includes the first and second frequency characteristics.

16. A method for correcting images among a plurality of electron beam observation devices in an electron beam observation system including the electron beam observation device to generate an image by irradiating an electron beam over a specimen and a computer system configured to be communicable with a plurality of the electron beam observation devices, the method comprising the steps of:

allowing a first electron beam observation device to generate a first image data by irradiating a first electron beam over a first pattern and a second pattern differing from the first pattern in a shape or a size, in which the first pattern and the second pattern are included in a specimen, or the first pattern is included in a first specimen and the second pattern is included in a second specimen;

allowing the first electron beam observation device to calculate a first frequency characteristic based on the first image data;

allowing a second electron beam observation device to generate a second image data by irradiating a second electron beam over the first and second patterns;

allowing the second electron beam observation device to calculate a second frequency characteristic based on the second image data;

allowing the computer system to specify a reference frequency characteristic based on the first and second frequency characteristics;

allowing one of the first and second electron beam observation devices to calculate a correction factor at a frequency selectively extracted from the reference frequency characteristic and one of the first and second frequency characteristics; and allowing one of the first and second electron beam observation devices to use the correction factor and correct a third image data acquired by one of the first and second electron beam observation devices.

17. A method for correcting images among a plurality of electron beam observation devices in an electron beam observation system that includes an electron beam observation device to generate an image by irradiating an electron beam over a specimen and a third computer system configured to be communicable with among a plurality of the electron beam observation devices, wherein a first electron beam observation device includes a first computer system that generate a first image data by irradiating a first electron beam over a first pattern and a second pattern differing from the first pattern in a shape or a size, and calculates a first frequency characteristic based on the first image data, in which the first pattern and the second pattern are included in a specimen, or the first pattern is included in a first specimen and the second pattern is included in a second specimen;

wherein a second electron beam observation device includes a second computer system that generates a second image data by irradiating a second electron beam over the first and second patterns and calculates a second frequency characteristic based on the second image data;

wherein the third computer system specifies a reference frequency characteristic based on the first and second frequency characteristics;

wherein one of the first and second computer systems calculates a correction factor at a frequency selectively extracted from the reference frequency characteristic and one of the first and second frequency characteristics; and wherein one of the first and second computer systems uses the correction factor and corrects a third image data acquired by one of the first and second electron beam observation devices.

18. A correction factor calculation method for correcting an image in an electron beam observation device that generates an image by irradiating a plurality of electron beams over a specimen, the method comprising the steps of:

allowing a first electron beam observation device to generate a first image data by irradiating a first electron beam over a first pattern and a second pattern differing from the first pattern in a shape or a size, in which the first pattern and the second pattern are included in a specimen, or the first pattern is included in a first specimen and the second pattern is included in a second specimen;

generating a second image data by irradiating a second electron beam over the first and second patterns; and calculating a correction factor at a frequency selectively extracted from first and second frequency characteristics calculated based on the first and second image data.

19. A method for correcting an image in an electron beam observation device that generates an image by irradiating a plurality of electron beams over a specimen, the method comprising the steps of:
- allowing a first electron beam observation device to generate a first image data by irradiating a first electron beam over a first pattern and a second pattern differing from the first pattern in a shape or a size, in which the first pattern and the second pattern are included in a specimen, or the first pattern is included in a first specimen and the second pattern is included in a second specimen;
- generating a second image data by irradiating a second electron beam over the first and second patterns;
- calculating a correction factor at a frequency selectively extracted from first and second frequency characteristics calculated based on the first and second image data; and
- using the correction factor and correcting a third image data acquired by the electron beam observation device.

20. An electron beam observation device that generates an image by irradiating a plurality of electron beams over a specimen,
- wherein the electron beam observation device
- generate a first image data by irradiating a first electron beam over a first pattern and a second pattern differing from the first pattern in a shape or a size, in which the first pattern and the second pattern are included in a specimen, or the first pattern is included in a first specimen and the second pattern is included in a second specimen;
- generates a second image data by irradiating a second electron beam over the first and second patterns;
- calculates a correction factor at a frequency selectively extracted from first and second frequency characteristics calculated based on the first and second image data; and
- uses the correction factor and corrects a third image data acquired by the electron beam observation device.

21. The correction factor calculation method according to claim 1, further comprising:
- calculating a plurality of the first frequency characteristic and averaging the plurality of the first frequency characteristic; and
- calculating a plurality of the second frequency characteristic and averaging the plurality of the second frequency characteristic.

22. The method for correcting images according to claim 5, further comprising:
- calculating a plurality of the first frequency characteristic and averaging the plurality of the first frequency characteristic; and
- calculating a plurality of the second frequency characteristic and averaging the plurality of the second frequency characteristic.

23. The electron beam observation system according to claim 6,
- wherein the first computer system calculates a plurality of the first frequency characteristic and averages the plurality of the first frequency characteristic; and
- wherein the second computer system calculates a plurality of the second frequency characteristic and averages the plurality of the second frequency characteristic.

24. The electron beam observation device according to claim 20,
- wherein the electron beam observation device calculates a plurality of the first frequency characteristic and averages the plurality of the first frequency characteristic; and
- wherein the electron beam observation device calculates a plurality of the second frequency characteristic and averages the plurality of the second frequency characteristic.

25. The correction factor calculation method according to claim 1,
- wherein the first image data is an image or is a signal waveform, and
- wherein the second image data is an image or is a signal waveform.

26. The method for correcting images according to claim 5,
- wherein the first image data is an image or is a signal waveform, and
- wherein the second image data is an image or is a signal waveform.

27. The electron beam observation system according to claim 6,
- wherein the first image data is an image or is a signal waveform, and
- wherein the second image data is an image or is a signal waveform.

28. The electron beam observation device according to claim 20,
- wherein the first image data is an image or is a signal waveform, and
- wherein the second image data is an image or is a signal waveform.

* * * * *